United States Patent
Yoshie et al.

(10) Patent No.: US 7,678,669 B2
(45) Date of Patent: Mar. 16, 2010

(54) METHOD FOR MANUFACTURING SEMICONDUCTOR SUBSTRATE

(75) Inventors: Toru Yoshie, Tokyo (JP); Kenji Komori, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 16 days.

(21) Appl. No.: 12/222,709

(22) Filed: Aug. 14, 2008

(65) Prior Publication Data

US 2009/0075451 A1    Mar. 19, 2009

(30) Foreign Application Priority Data

Sep. 14, 2007   (JP)   .............................. 2007-239948

(51) Int. Cl.
*H01L 21/30* (2006.01)

(52) U.S. Cl. ................ 438/458; 438/479; 257/E21.567
(58) Field of Classification Search ........................ None
See application file for complete search history.

(56) References Cited

U.S. PATENT DOCUMENTS

2008/0054426 A1* 3/2008 Ohno et al. ................. 257/678

FOREIGN PATENT DOCUMENTS

JP             11-087200     * 3/1999

* cited by examiner

*Primary Examiner*—Evan Pert
*Assistant Examiner*—Andres Munoz
(74) *Attorney, Agent, or Firm*—Rabin & Berdo, PC

(57) ABSTRACT

The present invention provides a method for manufacturing a semiconductor substrate in which a semiconductor wafer, formed of a material less likely to increase the hole diameter, is processed to a semiconductor substrate actually applicable to an existing manufacture line. An SiC wafer 12 is temporarily fixed to a Si wafer 18 through a wax 20. The SiC wafer 12 temporarily fixed to the Si wafer 18 is overlapped with a Si wafer 14 having the same hole diameter as the Si wafer 18 through an SOG film 16P. Orientation flats 14A and 18A are aligned, and while the Si wafers 14 and 18 are overlapped with each other, heating is performed under pressure to solidify the SOG film 16P, whereby an SOG solidified film 16S is formed. With the aid of the SOG solidified film 16S, the SiC wafer 12 is adhered to the Si wafer 14. The SiC wafer 12 is adhered at a predetermined position of the Si wafer 14 facing the SiC wafer 12 so as to be transferred from the Si wafer 18 to the Si wafer 14. The unneeded Si wafer 18 is detached, and the wax 20 is then removed.

14 Claims, 17 Drawing Sheets

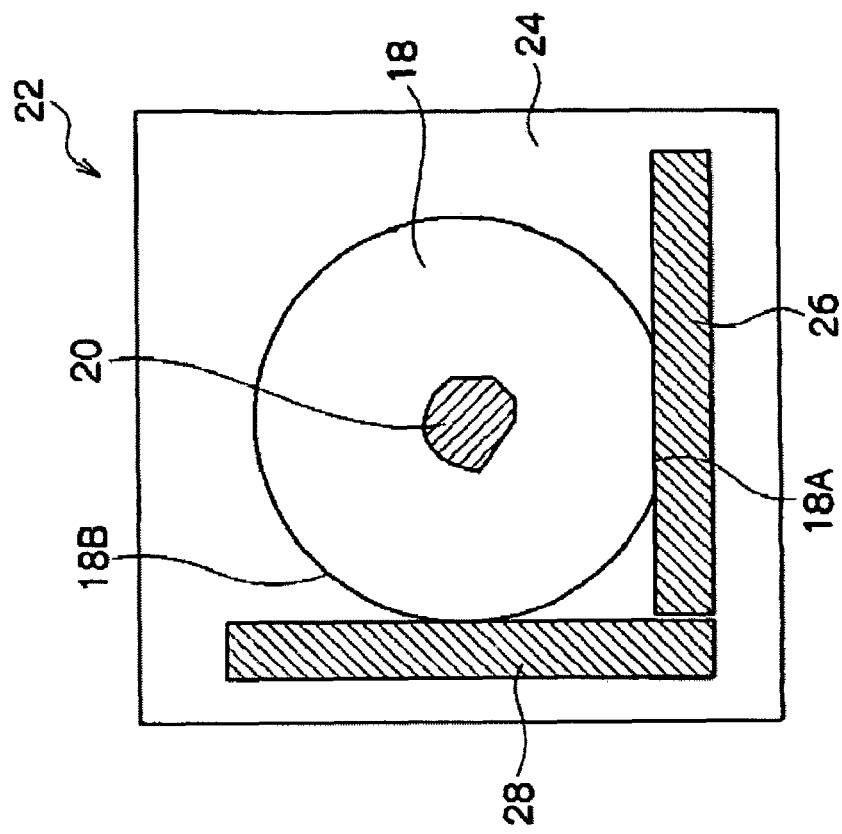
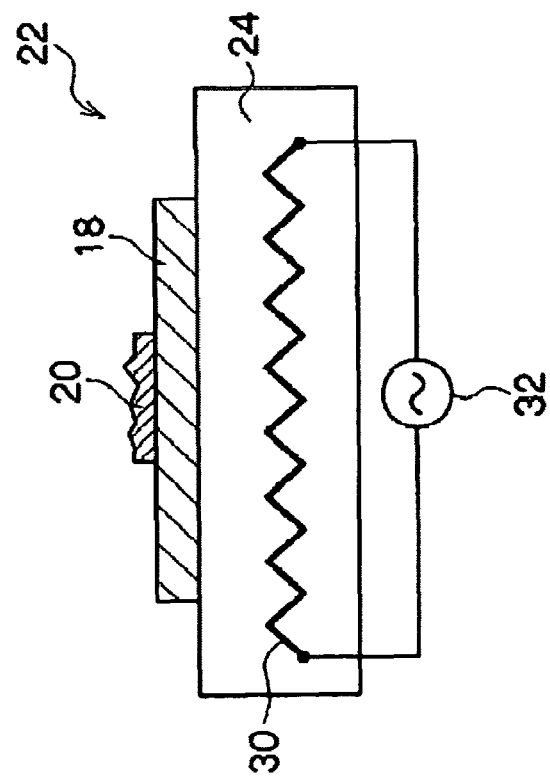

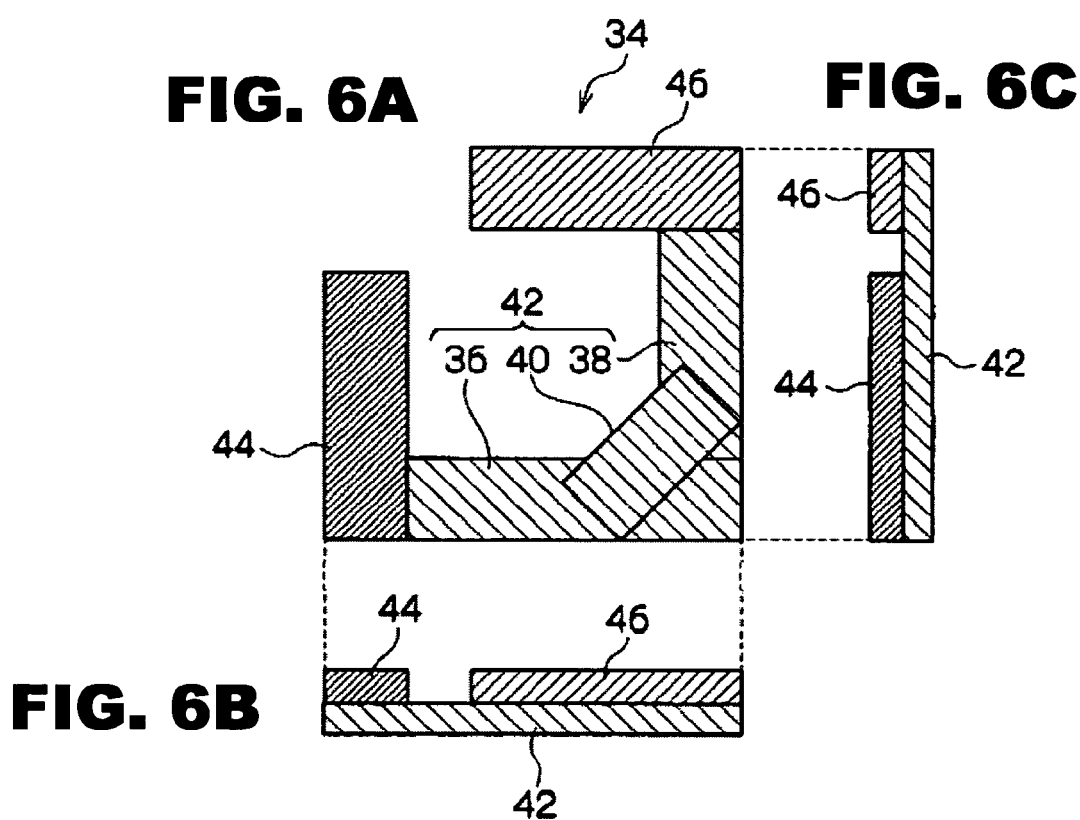

$$\sin\theta = \frac{D}{L}$$

$$\theta = \sin^{-1}\frac{D}{L}$$

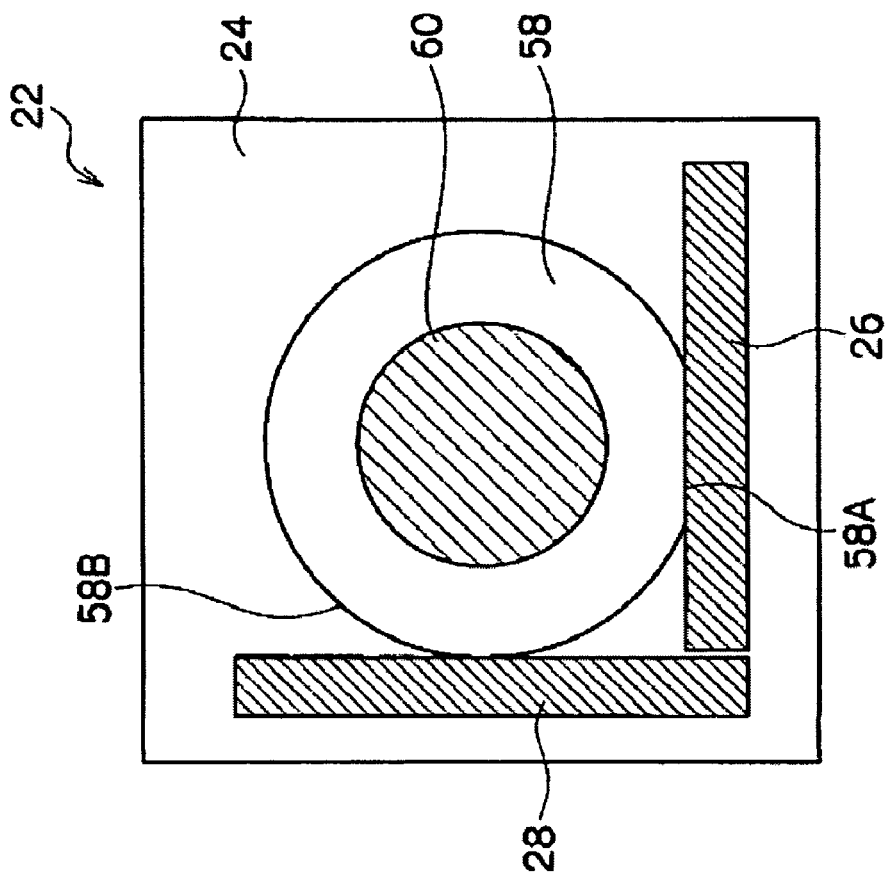
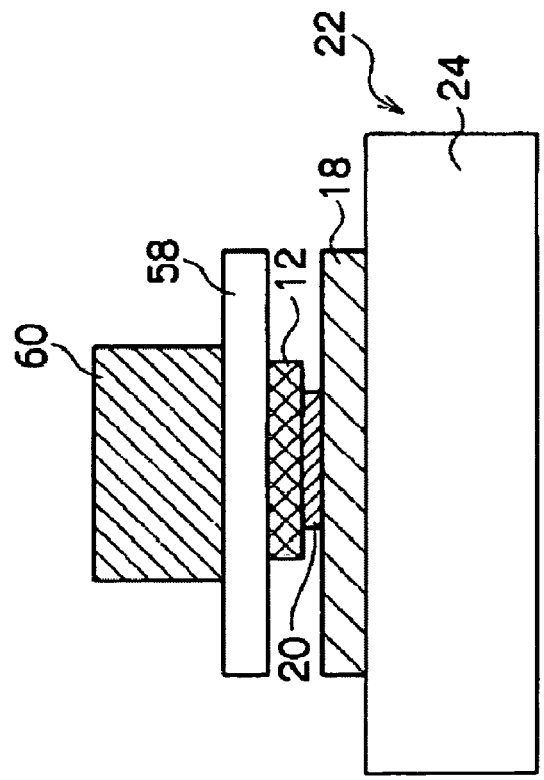

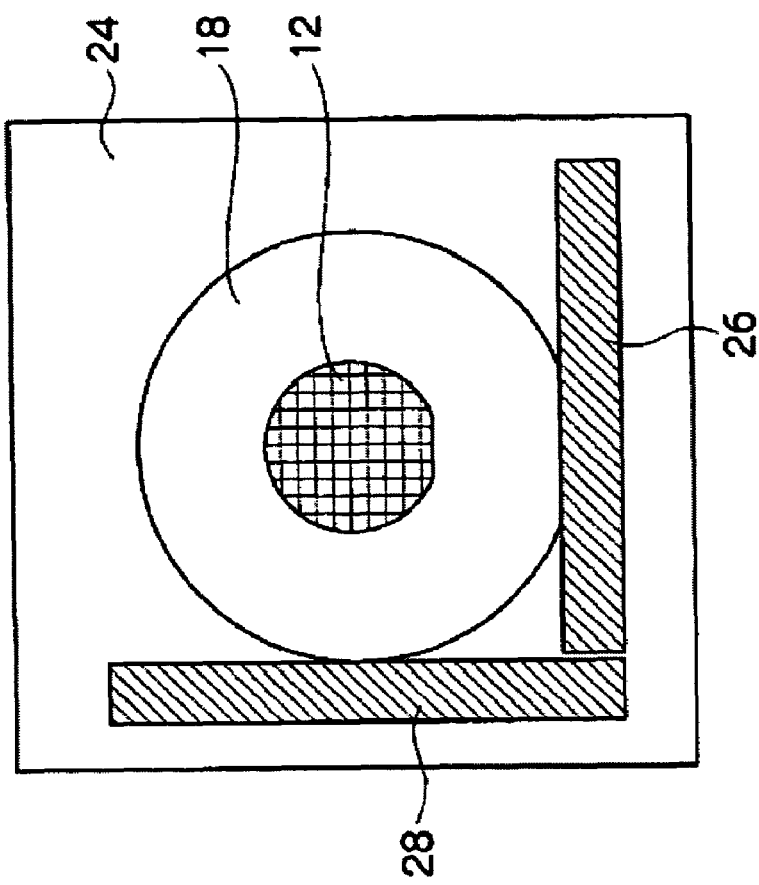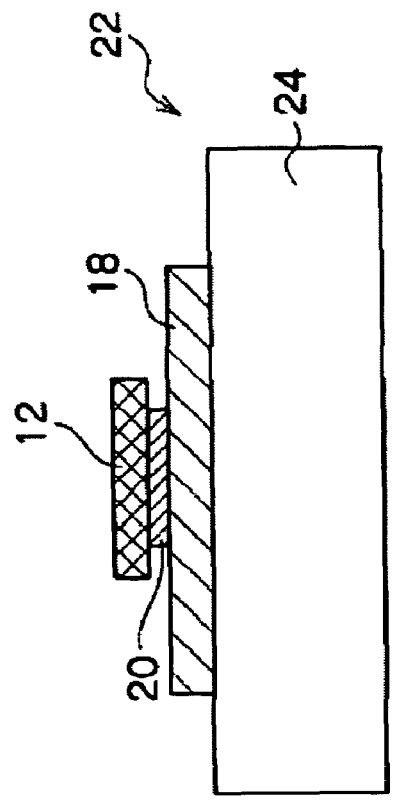
FIG. 11A
FIG. 11B

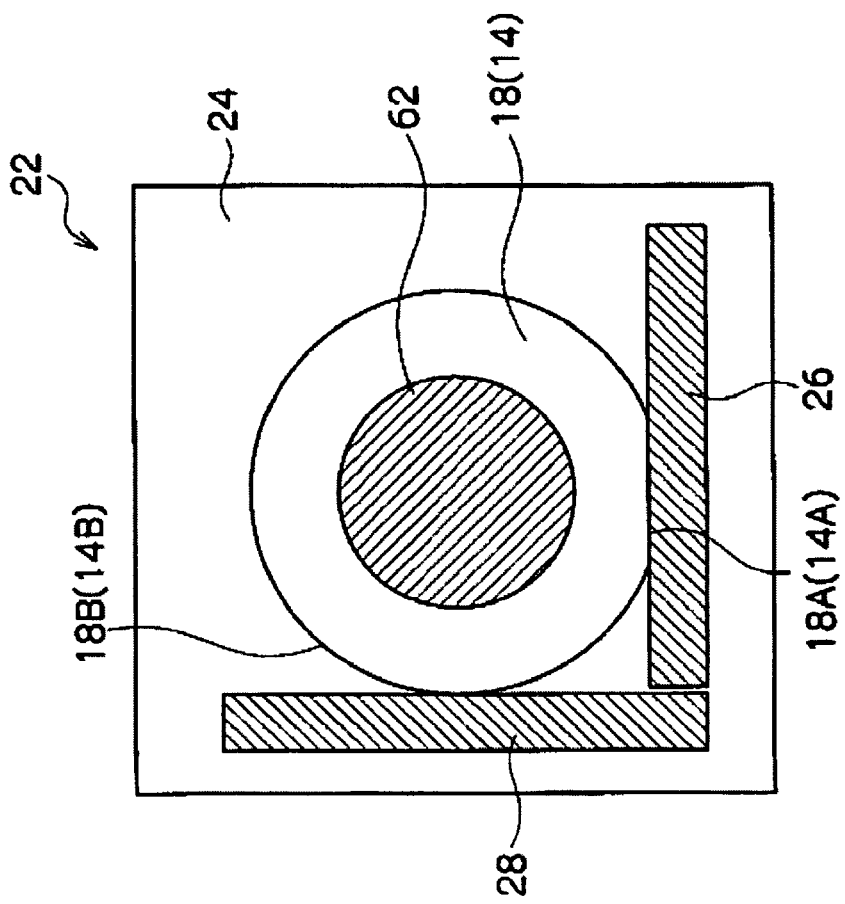
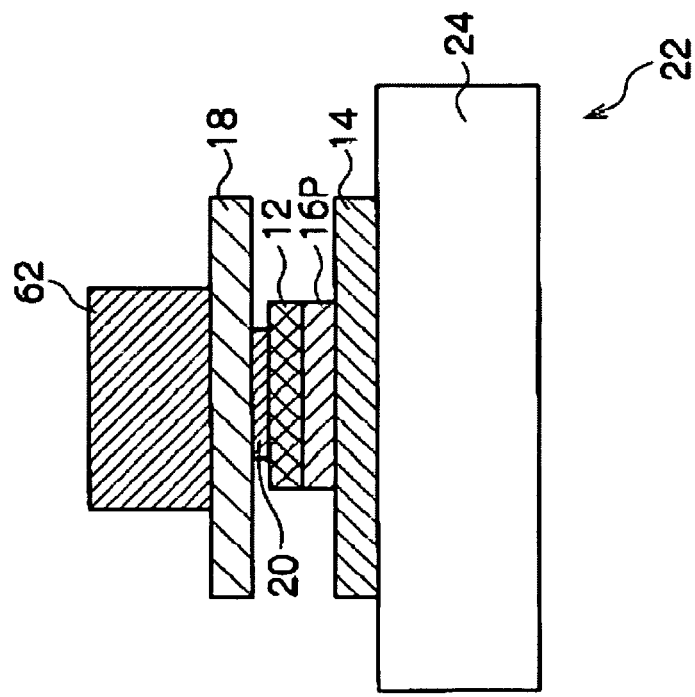

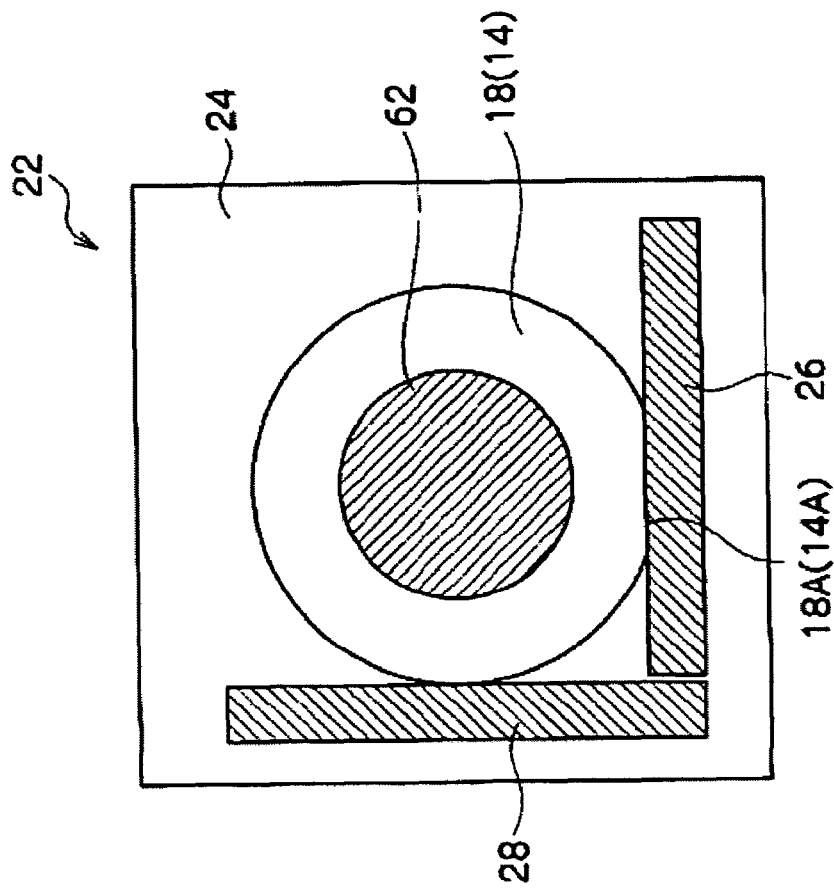
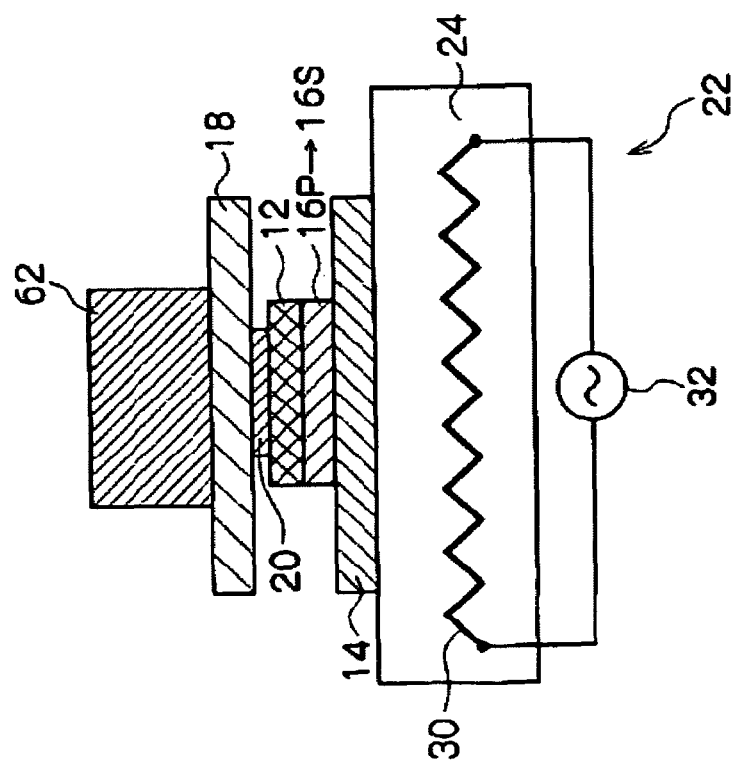
FIG. 14A
FIG. 14B

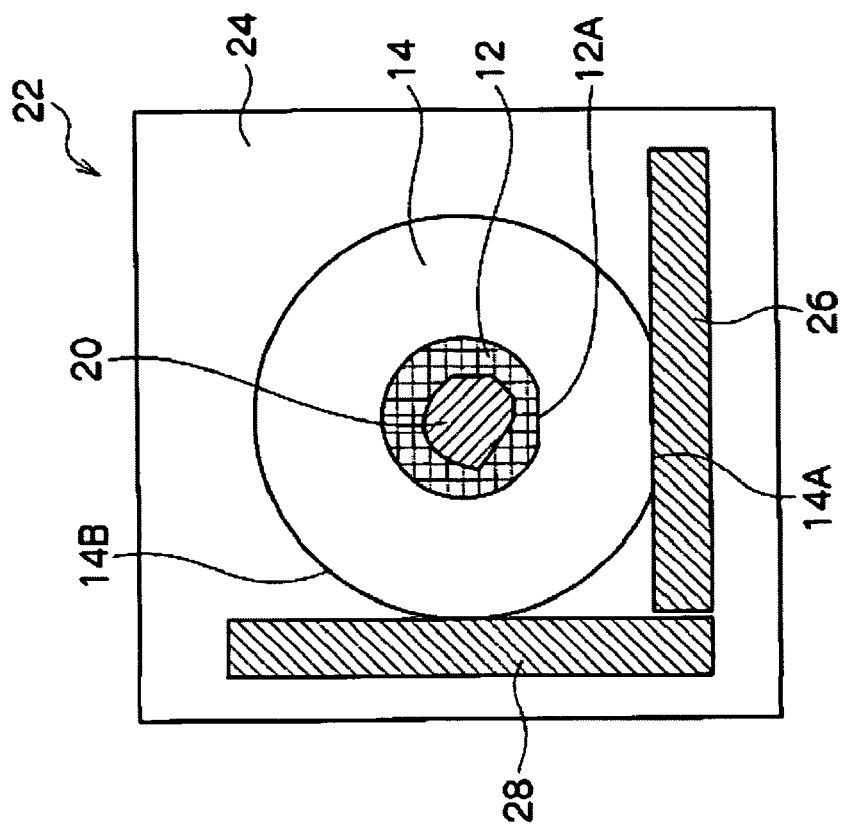
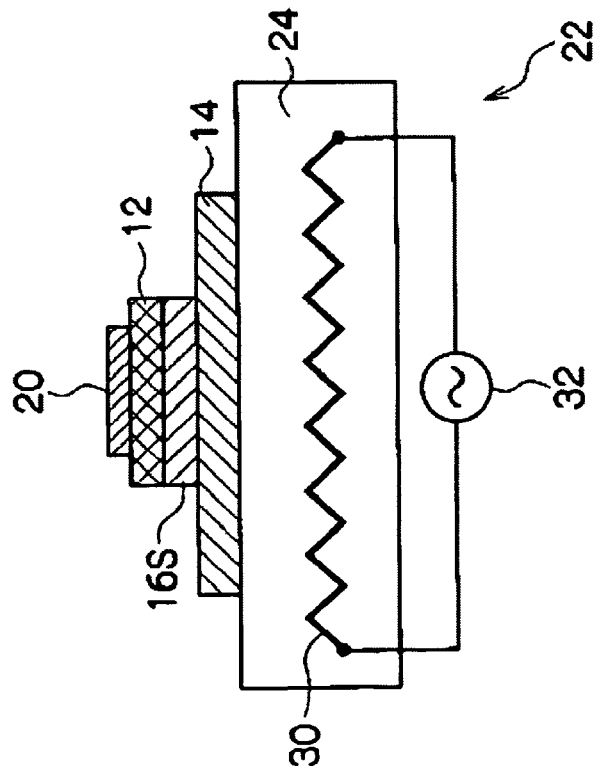
FIG. 15B
FIG. 15A

METHOD FOR MANUFACTURING SEMICONDUCTOR SUBSTRATE

CROSS REFERENCE TO RELATED APPLICATION

This application claims the priority of Application No. 2007-239948, filed Sep. 14, 2007 in Japan, the subject matter of which is incorporated herein by reference.

TECHNICAL FIELD OF THE INVENTION

The present invention relates to a method for manufacturing a semiconductor substrate, and more specifically relates to a method for manufacturing a semiconductor substrate, in which a semiconductor wafer, formed of a material less likely to increase the hole diameter, is processed to a semiconductor substrate capable of being manufactured in an existing manufacture line.

BACKGROUND OF THE INVENTION

A semiconductor device (SiC device) using a silicon carbide crystal has such characteristics as high withstanding pressure and high temperature operation, in comparison with the conventional semiconductor device (Si device) using a silicon crystal. The SiC device shows such an excellent performance based on basic characteristics of an SiC crystal. Carbon atoms are contained in the SiC crystal, whereby the distance between the atoms is reduced to realize the stronger coupling, thereby increasing the size of a band gap of a semiconductor twice or more. As a result, the withstanding pressure is increased to not less than twice electric field, and the semiconductor characteristics are maintained until reaching a high temperature.

Although the SiC crystal has an extremely excellent basic characteristics, the crystal growth is very difficult, and crystal defect is easily caused. Therefore, there is a problem that the hole diameter of the substrate (wafer) is hard to be increased. At present, an Si substrate (Si wafer) with a hole diameter of 5 to 8 inches is mostly used, while a very expensive 4H—SiC substrate (SiC wafer) with a hole diameter of 2 to 3 inches is mostly used. For this reason, in carrying out development of the semiconductor device, in many cases, the 4H—SiC substrate is cut into small chips to carry out trial manufacture, and thus, it is very difficult to obtain basic data for mass production.

When the development of the mass production techniques in the SiC device is carried out, it is very effective to use a device group used in the manufacturing of the Si device. In addition, know-how in mass production techniques used for the manufacturing of the Si device can be effectively utilized. Currently, the SiC device can be miniaturized to about 0.5 μm in the latest technology, and therefore, the microfabriaction can be applied to the SiC device using an existing Si device manufacturing device.

However, as above mentioned, in the SiC crystal, only a substrate with a hole diameter of up to about 3 inches can be produced. Therefore, it is difficult to use an existing Si device manufacturing device. In order to use the Si device manufacturing device, Japanese Patent Application Laid-Open (JP-A) No. 11-87200 proposes that, in an existing manufacture line for the Si device, a semiconductor substrate with an SiC substrate with a small hole diameter laminated to an Si substrate is processed in a similar manner to the Si substrate with a larger hole diameter.

However, the method described in JP-A-11-87200 has a problem that, since the SiC substrate and the Si substrate are directly applied with each other by an SDB (silicon direct bonding) method, the alignment between the SiC substrate and the Si substrate, or the alignment among plural SiC substrates is difficult.

The SiC substrate and the Si substrate have a cutout called an orientation flat in accordance with the in-plane crystal orientation. The substrates having the same size can be processed while the position and the crystal orientation are aligned using the orientation flat. However, in the SiC substrate and the Si substrate having different sizes from each other, it is difficult to align the position and the crystal orientation. If the position and the crystal orientation of the SiC substrate are not fixed, it is difficult to process in an existing device manufacturing device.

OBJECTS OF THE INVENTION

The present invention has been made in view of the above problems, and an object of the present invention is to provide a method for manufacturing a semiconductor substrate, in which a semiconductor wafer formed of a material (especially, silicon carbide single crystal) less likely to increase the hole diameter is processed to a semiconductor substrate actually applicable to an existing manufacture line.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In order to achieve the above object, according to an aspect of the present invention, there is provided a method for manufacturing a semiconductor substrate, including: a temporal fixation step of preparing a wafer formed of a semiconductor single crystal and a first substrate with a hole diameter larger than the wafer to overlap the wafer and the first substrate with each other so that the front surface of the wafer and the first substrate face each other, and thus to perform alignment of the wafer with reference to an orientation flat of the wafer and a first mark provided in the first substrate, whereby the wafer is temporarily fixed to a predetermined position of the first substrate in a position-adjustable manner; an application step of applying an adhesive on the rear surface of the wafer temporarily fixed to the first substrate; an adhesion step of preparing a second substrate, which has the same hole diameter and shape as the first substrate and has a second mark at the same position as the first substrate, to perform alignment so that the first and second substrates are overlapped with each other with reference to the first and second marks, and thus to overlap the wafer and the second substrate so that the rear surface of the wafer and the second substrate face each other, whereby the wafer temporarily fixed to the first substrate is adhered to the second substrate through the adhesive; and a removal step of removing the first substrate to which the wafer is temporarily fixed.

In the method of manufacturing a semiconductor device, first, the wafer formed of a semiconductor single crystal is overlapped with the first substrate with a hole diameter larger than the wafer to perform the alignment, whereby the wafer is temporarily fixed to a predetermined position of the first substrate. Since the wafer is temporarily fixed to the first substrate, it can be moved or detached. The position of the wafer can be repeatedly adjusted until the precise alignment of the wafer is performed.

Second, the first and second substrates are overlapped with each other, and the wafer temporarily fixed to the first substrate is adhered to the second substrate through an adhesive. Since the second substrate has the same hole diameter and shape as the first substrate, the first and second substrates are easily just overlapped with each other. A predetermined position of the second substrate faces a predetermined position of the first substrate. The wafer temporarily fixed to the predetermined position of the first substrate is adhered to the facing predetermined position of the second substrate so as to be transferred from the first substrate to the second substrate. The precise alignment is performed in the process of temporarily fixing the wafer to the first substrate, whereby the wafer is precisely transferred at the predetermined position of the second substrate.

Finally, the first substrate to which the wafer is temporarily fixed is removed thereby to obtain a laminated type of semiconductor substrate in which the wafer formed of a semiconductor single crystal is adhered at a predetermined position of the second substrate having a hole diameter larger than the first substrate. There are many semiconductor materials less likely to increase the hole diameter of a wafer such as a silicon carbide (SiC) single crystal. However, according to the manufacturing method, the semiconductor wafer is laminated to the substrate with a large hole diameter while controlling the "position" and the "crystal orientation" of the semiconductor wafer with a smaller hole diameter, whereby the semiconductor substrate can be produced. Thus, the semiconductor substrate produced from the semiconductor wafer, formed of a material less likely to increase the hole diameter, can be actually used in an existing manufacture line.

In the above manufacturing method, in the temporal fixation step, a wax having a predetermined melting point is applied to the first substrate, the first substrate is heated at the melting point or higher to fuse the wax, and the first substrate is cooled at below the melting point after the alignment of the wafer, whereby the wafer can be temporarily fixed to the first substrate. It is preferable to use the wax having a melting point of 100° C. or higher and a heat resistance of 400° C. or higher. Further, in the temporal fixation step, the wafer can be temporarily fixed to the first substrate in such a state that the wafer is uniformly pressed from the rear surface side.

Further, in the above manufacturing method, in the application step, a spin-on glass (SOG) solution as an adhesive is applied to form an SOG film, and at the same time, in the adhesion step, the wafer and the second substrate are overlapped with each other and then the SOG film is heated under pressure to solidify the SOG film, whereby the wafer can be adhered to the second substrate.

The first and second substrates preferably have a hole diameter of 5 to 8 inches. The first substrate and the second substrate are preferably any one selected from the group consisting of a silicon substrate, a quartz substrate, and a sapphire substrate. A film thickness of the first substrate and the second substrate is 300 µm (micro meters) to 2 mm.

Further, the first mark and the second mark can be assumed to be orientation flats. In this case, the wafer can be aligned so that the orientation flat of the wafer is parallel to the orientation flat of the first substrate.

For instance, the wafer may be aligned using an alignment jig including: an L-shaped guide part including an elongated first plate material having one side surface in the longitudinal direction with which the orientation flat of the first substrate is brought into contact, and an elongated second plate material having one end surface which is bonded to the side surface on one end side of the first plate material so that the first and second plate materials form an L shape and also one side surface in the longitudinal direction with which an outer edge of the first substrate is brought into contact; an elongated first arm which is bonded in the state of being overlapped with the first plate material so as to intersect with the first plate material of the guide part and has one end surface brought into contact with the orientation flat of the wafer; and an elongated second arm which is bonded to the second plate material of the guide part in the state of being overlapped with the second plate material so as to intersect with the second plate material and has one end surface brought into contact with a circular-shaped outer edge of the wafer.

In addition, a pattern including straight lines parallel or perpendicular to the orientation flat of the wafer may be previously formed in the wafer, and in the temporal fixation step, the angle formed by the straight lines and the orientation flat of the first substrate may be observed to perform the alignment of the wafer. In this case, it is preferable that the wafer is aligned so that the angle formed by the straight lines and the orientation flat of the first substrate is not more than 0.3° (degrees)

According to this invention, a semiconductor wafer formed of a material less likely to increase the hole diameter, such as a silicon carbide single crystal, is laminated to a substrate with a larger hole diameter while controlling the "position" and the "crystal orientation", whereby the semiconductor wafer can be processed to a semiconductor substrate actually applicable to an existing manufacture line.

BRIEF DESCRIPTION OF THE DRAWINGS

FIGS. 3A and 3B are views showing a constitution of a work table on which the laminating operation is performed, wherein FIG. 3A is a top plan view of the work table, and FIG. 3B is a side elevational view of the front side of the work table;

FIGS. 4A and 4B are views showing a process of coating with a wax, wherein FIG. 4A is a side elevational view showing a state that the wax is coated on a Si wafer placed on the work table, and FIG. 4B is a top plan view of the state shown in FIG. 4A;

FIGS. 5A and 5B are views showing a process of putting an SiC wafer with a small diameter on the Si wafer, wherein FIG. 5A is a side elevational view showing a state in which the SiC wafer is put on the Si wafer placed on the work table, and FIG. 5B is a top plan view of the state shown in FIG. 5A;

FIGS. 6A to 6C are schematic views showing a constitution of an "alignment jig" used for alignment, wherein FIG. 6A is a top plan view of the alignment jig, FIG. 6B a side elevational view of the front side of the alignment jig, and FIG. 6C is a side elevational view of the right side of the alignment jig;

FIGS. 8A and 8B are views for explaining a method for inspecting the rotational accuracy, wherein FIG. 8A is a plan view showing a state in which a laminated substrate 10 is placed on an observation table, and FIG. 8B is a view for explaining a method for measuring a deviation amount in a rotational direction;

FIGS. 9A to 9B are views showing a process of applying pressure to the SiC wafer, wherein FIG. 9A is a side elevational view showing a state in which a load is applied onto the SiC wafer on the work table, and FIG. 9B is a top plan view of the state shown in FIG. 9A;

FIGS. 10A and 10B are views showing a process of solidifying the wax, wherein FIG. 10A is a side elevational view showing a state in which the wax is solidified on the work table to temporarily fix the SiC wafer, and FIG. 10B is a top plan view of the state shown in FIG. 10A;

FIGS. 11A to 11B are views showing a process of removing the weight and so on, wherein FIG. 11A is a side elevational view showing a state in which the weight and so on are removed from above the work table, and FIG. 11B is a top plan view of the state shown in FIG. 11A;

FIGS. 12A and 12B are views showing a process of applying an SOG coating solution, wherein FIG. 12A is a cross-sectional view showing a state in which the SOG coating solution is applied to the temporarily fixed SiC wafer, and FIG. 12B is a front side plan view of the state shown in FIG. 12A;

FIGS. 13A and 13B are views showing a process of stacking the SiC wafer on the Si wafer to be applied, wherein FIG. 13A is a side elevational view showing a state in which the SiC wafer is stacked on the Si wafer on the work table, and FIG. 13B is a top plan view of the state shown in FIG. 13A;

FIGS. 14A and 14B are views showing a process of adhering the SiC wafer with the SOG film, wherein FIG. 14A is a side elevational view showing a state in which the SiC wafer is adhered above the work table, and FIG. 14B is a top plan view of the state shown in FIG. 14A;

FIGS. 15A and 15B are views showing a process of removing the unneeded Si wafer, wherein FIG. 15A is a side elevational view showing a state in which the unneeded Si wafer is removed from above the work table, and FIG. 15B is a top plan view of the state shown in FIG. 15A;

FIGS. 16A and 16B are views showing a process of removing the wax, wherein FIG. 16A is a cross-sectional view of the laminated substrate with the wax removed, and FIG. 16B is a front side plan view of the state shown in FIG. 16A.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Hereinafter, an example of an embodiment of the present invention will be described in detail with reference to the drawings.

<Laminated Type Semiconductor Substrate>

Figure 1A:
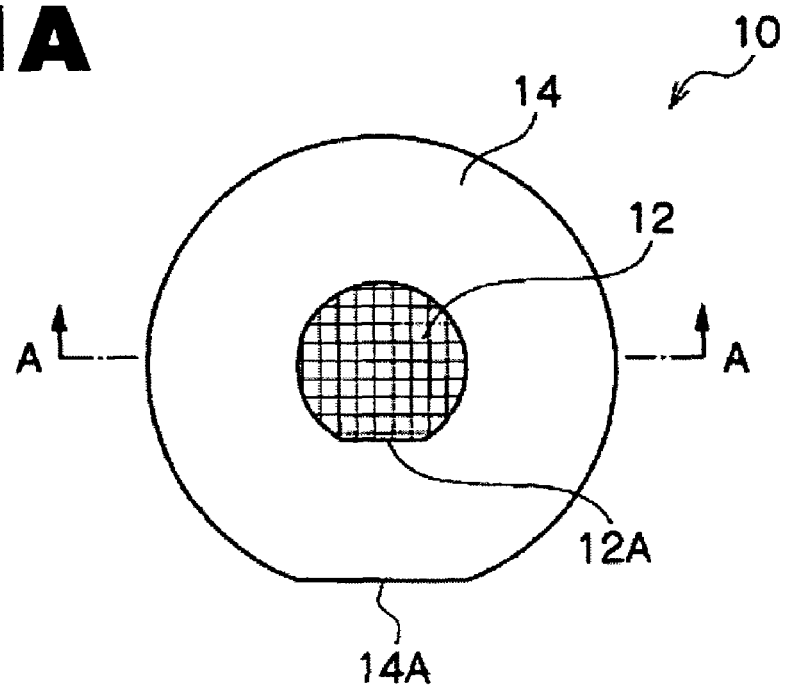
FIG. 1A is a front side plan view of a laminated substrate.
Figure 1B:
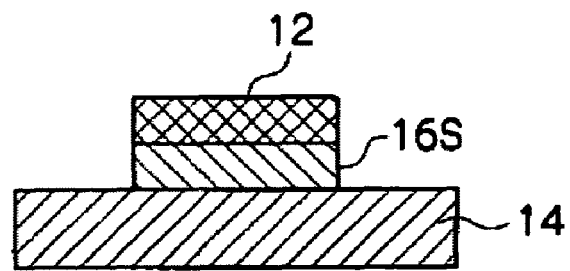
FIG. 1B is a cross-sectional view taken along a line A-A shown in FIG. 1A.

First, description will be given of the constitution of a laminated type semiconductor substrate (hereinafter referred to as "laminated substrate") manufactured in the embodiment of the invention. FIG. 1A is a front side plan view of the laminated substrate. FIG. 1B is a cross-sectional view taken along a line A-A shown in FIG. 1A.

As shown in FIG. 1A, a laminated substrate 10 is configured such that a wafer 12 (SiC wafer) with a small hole diameter which is formed of a silicon carbide single crystal is laminated to a substantially central part of a silicon wafer (Si wafer) 14 with a hole diameter larger than the SiC wafer 12. The SiC wafer 12 corresponds to the "wafer formed of a semiconductor single crystal" of this invention, while the Si wafer 14 corresponds to the "second substrate" of this invention. In this embodiment, although the Si wafer is used as the "second substrate", the "second substrate" with a large hole diameter of this invention is not limited to a semiconductor substrate as described below.

The SiC wafer 12 is formed into a disk-like shape and has an orientation flat 12A formed on the outer edge thereof. The orientation flat 12A is a linear cutout provided in order to show "crystal orientation". The Si wafer 14 is also formed into a disk-like shape and has an orientation flat 14A formed on the outer edge thereof The orientation flat 12A of the Sic wafer 12 is aligned so as to be parallel to the orientation flat 14A of the Si wafer 14 and laminated to the Si wafer 14.

An SiC single crystal ingot is formed of silicon and carbon by using a sublimation method to be sliced, whereby the SiC wafer 12 can be obtained. It is so difficult to increase the hole diameter of the SiC wafer 12 that only wafer with a hole diameter of 2 to 3 inches (diameter is 50 to 75 mm) can be obtained at present. In the example of this embodiment, the SiC wafer 12 with a hole diameter of 2 inches (diameter of 50 mm) and a thickness of 350 µm is used.

Polycrystalline silicon is melted in an electric furnace, and an Si single crystal ingot is pulled from a melt by, for example, the Czochralski method to be sliced into a thickness of 300 µm (micrometers) to 2 mm, thereby to obtain the Si wafer 14. The wafer with a hole diameter of 5 to 8 inches (diameter is 125 to 200 mm) is mostly used as the Si wafer 14 at present. In the example of this embodiment, the Si wafer 14 with a hole diameter of 6 inches (diameter of 150 mm) and a thickness of 625 µm is used.

As shown in FIG. 1B, the SiC wafer 12 is adhered to the Si wafer 14 with an SOG solidified film 16S interposed therebetween. The SOG solidified film 16S is a heat-resistant silica-based coating film formed by a spin-on glass (SOG) method. The SOG solidified film 16S has at least a heat resistance of 400° C. or higher. As described below, when high-temperature heat treatment is applied to the SOG solidified film 16S, the heat resistance can be increased to close to 1000° C.

In the SOG method, a coating solution with alkoxysilane dissolved in the solvent is applied onto a base material, followed by heat treatment to be solidified by the dehydration condensation reaction of alkoxysilane, thereby to form the silica-based coating film. The SOG coating solution corresponds to the "adhesive" of the invention. The SOG coating solution is obtained by dissolving alkoxysilane, which uses silicon-oxygen (Si—O) combination as the framework and contains silanol group (—Si—OH), in an organic solvent vaporized at about 300° C. The specific film formation method of the SOG solidified film 16S will be described below.

<Method for Manufacturing Semiconductor Substrate>

FIGS. 2A to 2D are schematic views showing a manufacturing process for a semiconductor substrate according to the embodiment of the invention. The outline of the manufacturing process will be briefly explained with reference to the drawings. Although the orientation flat is not illustrated, the orientation flat is formed in each wafer. First, in a "temporal fixation process" shown in FIG. 2A, the SiC wafer 12 is temporarily fixed to an SiC wafer 18 other than the SiC wafer 14 through a heat-stable wax 20. The Si wafer 18 has the same hole diameter as the Si wafer 14. The Si wafer 18 also has an orientation flat 18A formed at the same position as the orientation flat 14A of the Si wafer 14. The SiC wafer 12 is precisely aligned so that the orientation flat 12 becomes parallel to the orientation flat 18A to be temporarily fixed to the Si wafer 18.

In the temporal fixation process, the front surface of the SiC wafer to be subjected to various processings is temporarily fixed to the Si wafer 18 through the wax 20. Since the wax 20 used for the temporal fixation is heated to not less than the melting point to be fused, the SiC wafer 12 can be moved and detached. Therefore, the position of the SiC wafer 12 can be repeatedly adjusted on the Si wafer 18 until the precise alignment of the SiC wafer 12 is performed. In addition, the wax 20 protects the surface of the SiC wafer 12 from damages, such as scratches, particles (adhesion of dusts), and contamination.

Figure 2A:
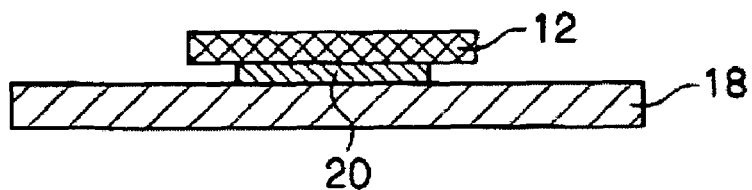
FIGS. 2A to 2D are schematic views showing a manufacturing process according to an embodiment of the present invention.
Figure 2B:
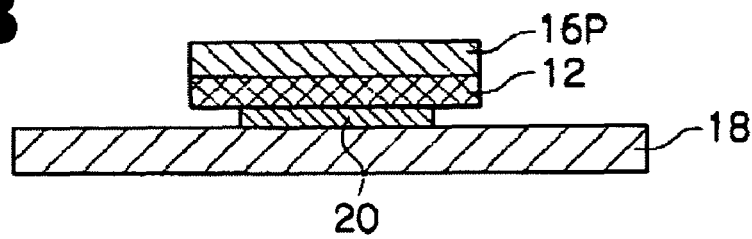
Figure 2C:
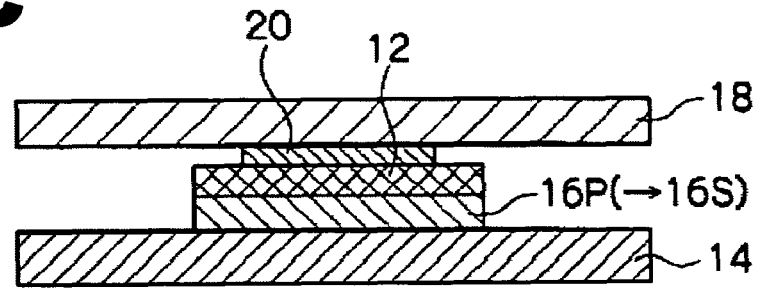

Second, in an "application process" shown in FIG. 2B, an SOG coating solution is applied onto the SiC wafer 12, which is temporarily fixed to the Si wafer 18, to form an SOG film 16P on the rear surface side of the SiC wafer 12. Third, in an "adhesion process" shown in FIG. 2C, the SiC wafer 12 temporarily fixed to the Si wafer 18 is overlapped with the Si wafer 14 with the SOG film 16P interposed between the SiC wafer 12 and the Si wafer 14. The orientation flats 14A and 18A are aligned, whereby the Si wafers 14 and 18 having the same hole diameter are easily overlapped.

Heating is performed under pressure in such a state that the Si wafer 14 and the Si wafer 18 are overlapped with each other to solidify the SOG film 16P, thereby forming the SOG solidified film 16S. The SiC wafer 12 is adhered to the Si wafer 14 through the SOG solidified film 16S. The SiC wafer 12 temporarily fixed to the predetermined position of the Si wafer 18 is adhered to the predetermined position of the Si wafer 14 facing the Si wafer 18 so as to be transferred from the Si wafer 18 to the Si wafer 14. If the SiC wafer 12 is precisely aligned in the process of temporarily fixing the SiC wafer 12 to the Si wafer 18, the SiC wafer 12 is precisely transferred to a predetermined position of the Si wafer 14.

Figure 2D:
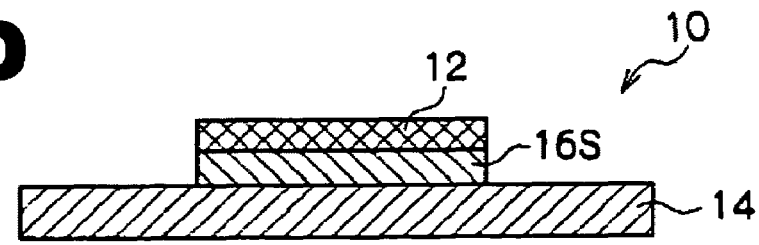

Fourth, in a "removal process" shown in FIG. 2D, the Si wafer 18 to which the SiC wafer 12 is temporarily fixed is detached. In addition, the unneeded wax 20 is removed. This According to the constitution shown in FIG. 2A to 2D, it is possible to easily obtain the laminated substrate 10 configured such that the SiC wafer 12 with a small hole diameter is laminated to a substantially central part of the Si wafer 14 with a larger hole diameter. Since the SiC wafer 12 is precisely transferred to the predetermined position of the Si wafer 14, the orientation flat 12A of the SiC wafer 12 becomes parallel to the orientation flat 14A of the Si wafer 14 (see, FIG. 1A). Thus, the crystal orientation of the SiC wafer 12 can be judged from the orientation flat 14A of the Si wafer 14.

Figure 3A:
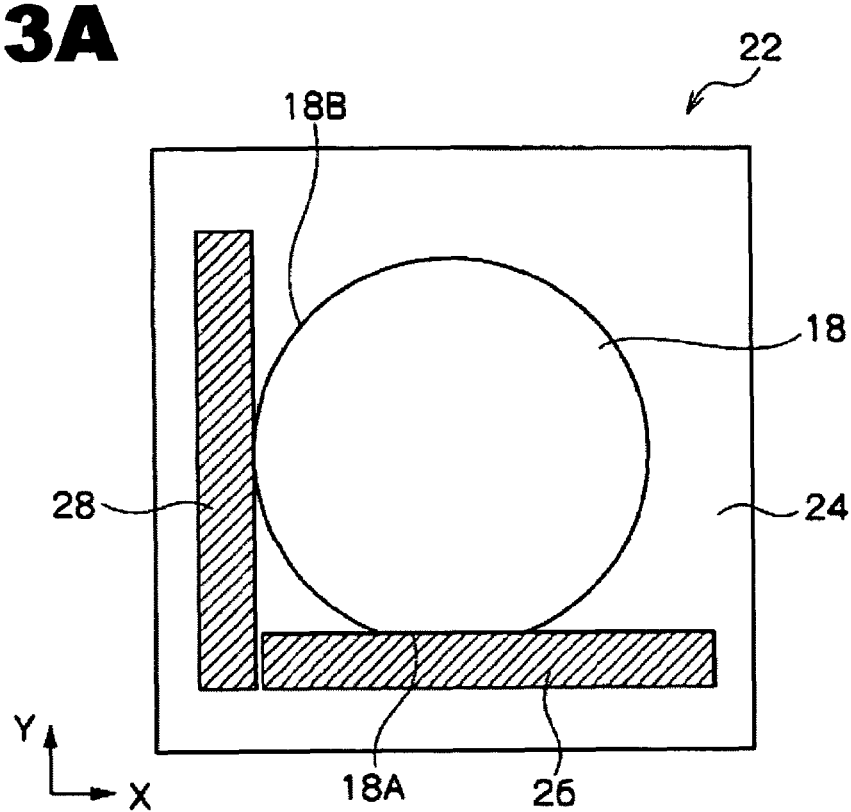
Figure 3B:
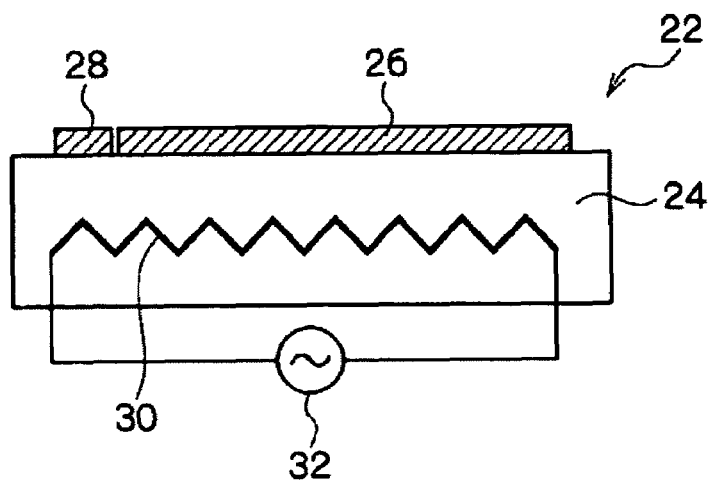

Next, a manufacturing process according to the embodiment of the invention will be described in detail with reference to FIGS. 3 to 16. FIG. 3 shows a constitution of a work table on which the laminating operation is performed. FIG. 3A is a top plan view of the work table. FIG. 3B is a side elevational view of the front side of the work table.

As shown in FIG. 3A, the work table 22 has a plate 24 which has a rectangular shape as viewed from the above. There are guides 26 and 28 placed on the surface of the plate 24. The guides 26 and 28 are each constituted of an elongated heat resistant sheet material. The guide 26 is placed on the plate 24 so that the longitudinal direction is parallel to one side of the plate 24 extending in the X direction. The guide 28 forms an L-like shape with the guide 26 and is placed on the plate 24 so that the longitudinal direction is parallel to one side of the plate 24 extending in the Y direction perpendicular to the X direction.

As shown in FIG. 3B, the plate 24 includes a resistance heater 30 therein. The resistance heater 30 is connected to an AC source 32. The temperature of the plate 24 can be increased until about 600° C. (degrees C.) by the resistance heater 30. The On and off and temperature adjustment of the resistance heater 30 can be realized by a switch (not shown).

For instance, when the Si wafer 18 is placed on the plate 24 to perform a work operation, the orientation flat 18A of the Si wafer 18 is brought into contact with the guide 26 extending in the X direction, as shown in FIG. 3A. At the same time, an outer edge 18A of the Si wafer 18 is brought into contact with the guide 28 extending in the Y direction. According to this, the Si wafer 18 is positioned at a predetermined position on the plate 24 to be placed on the plate 24.

(Temporal Fixation Process for Wafer)

FIG. 4 shows a process of coating with a wax. FIG. 4A is a side elevational view showing a state that the wax is coated on a Si wafer placed on the work table. FIG. 4B is a top plan view of the state shown in FIG. 4A.

As shown in FIGS. 4A and 4B, the Si wafer 18 is placed on the plate 24 on a work table 22. The orientation flat 18A is brought into contact with the guide 26, and the outer edge 18B is brought into contact with the guide 28, whereby the Si wafer 18 is positioned at a predetermined position on the plate 24 and placed on the plate 24. The Si wafer 18 placed on the plate 24 is heated by the resistance heater 30. In this embodiment, the Si wafer 18 is heated at 180° C. (degrees C.). The heat-stable wax 20 is coated near the center of the heated Si wafer 18. As the wax 20, a wax, which has an upper temperature limit higher than the vaporization temperature of an organic solvent contained in the SOG coating solution, is used. In this embodiment, the wax which has a melting point of about 150° C. (degrees C.) and is not altered even at about 350° C. (degrees C.) is used.

Figure 5B:
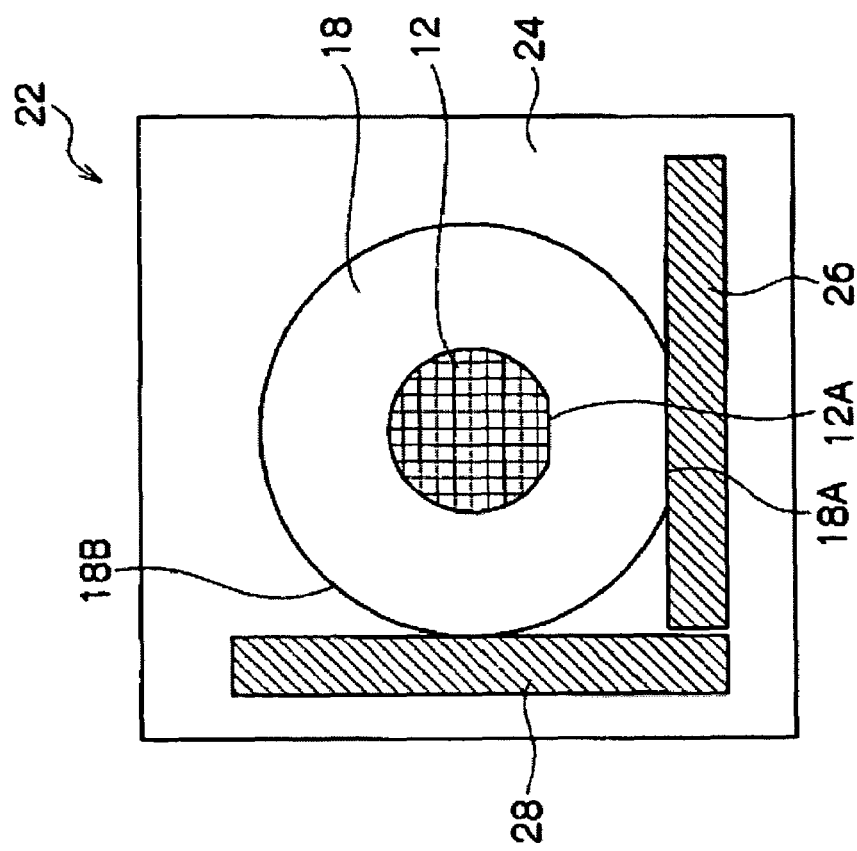
Figure 5A:
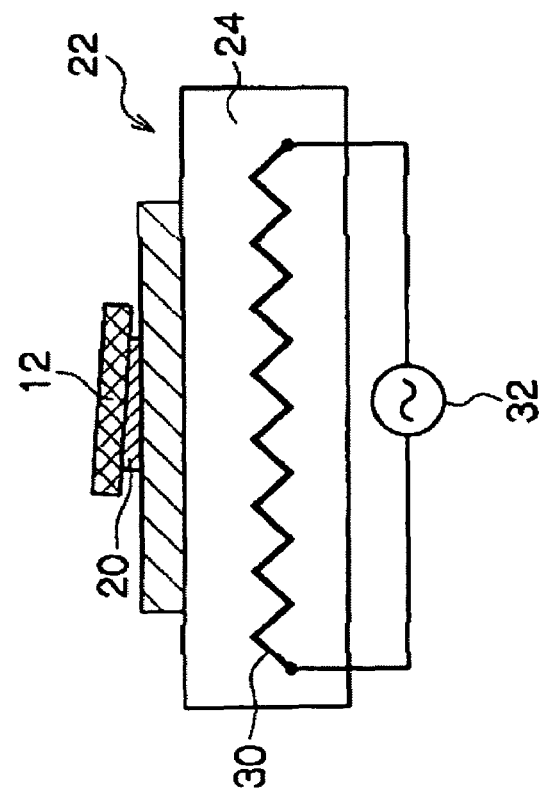

FIG. 5 shows a process of putting the SiC wafer with a small diameter on the Si wafer. FIG. 5A is a side elevational view showing a state in which the SiC wafer is put on the Si wafer placed on the work table, and FIG. 5B is a top plan view of the state shown in FIG. 5A.

As shown in FIGS. 5A and 5B, the Si wafer 12 is placed on the wax 20 coated on the Si wafer 18, with the front surface side thereof directed downward. The SiC wafer 12 is placed on the wax 20 so as to be positioned at a substantially center of the Si wafer 18. Since the Si wafer 18 remains heated at 180° C. (degrees-C.) by the resistance heater 30, the wax 20 is fused to allow the SiC wafer 12 to be moved on the wax 20, and thus, the position of the SiC wafer 12 can be adjusted. The SiC wafer 12 is aligned so that the orientation flat 12A is parallel to the orientation flat 18A of the Si wafer 18. Incidentally, after the SiC wafer 12 and the Si wafer 18 are temporarily removed from the work table 22, the alignment of the SiC wafer 12 may be performed at a different place.

Here, an example of the method of aligning the SiC wafer 12 will be described with reference to FIGS. 6 to 8. In this example, the SiC wafer 12 is aligned at a place other than the work table 22. FIG. 6 is a schematic view showing a constitution of an "alignment jig" used for alignment. FIG. 6A is a top plan view of the alignment jig. FIG. 6B is a side elevational view of the front side of the alignment jig. FIG. 6C is a side elevational view of the right side of the alignment jig.

As shown in FIGS. 6A to 6C, the alignment jig 34 has an L-shaped guide part 42 having an elongated first plate material 36 and an elongated second plate material 38. One end surface of the second plate material 38 is bonded to the side surface on one end side of the first plate material 36 so as to form an L shape with the first plate material 36. The first and second plate materials 36 and 38 are firmly fixed through a beam-like reinforcing plate 40 laid between the first and second plate materials 36 and 38.

The alignment jig 34 further has elongated first and second arms 44 and 46. The first arm 44 is bonded to one end of the L-shaped guide part 42 in the state of being overlapped with the first plate material 36 of the guide part 42 so as to intersect with the first plate material 36. The second arm 46 is bonded to the other end of the L-shaped guide part 42 in the state of being overlapped with the second plate material 38 of the guide part 42 so as to intersect with the second plate material 38. The first and second arms 44 and 46 are respectively disposed so as to extend toward the inner angle of the L-shaped guide part 42. The first arm 44 is formed so that the one end surface (side surface on the short side) is parallel to the side surface of the first plate material 36.

Figure 7:
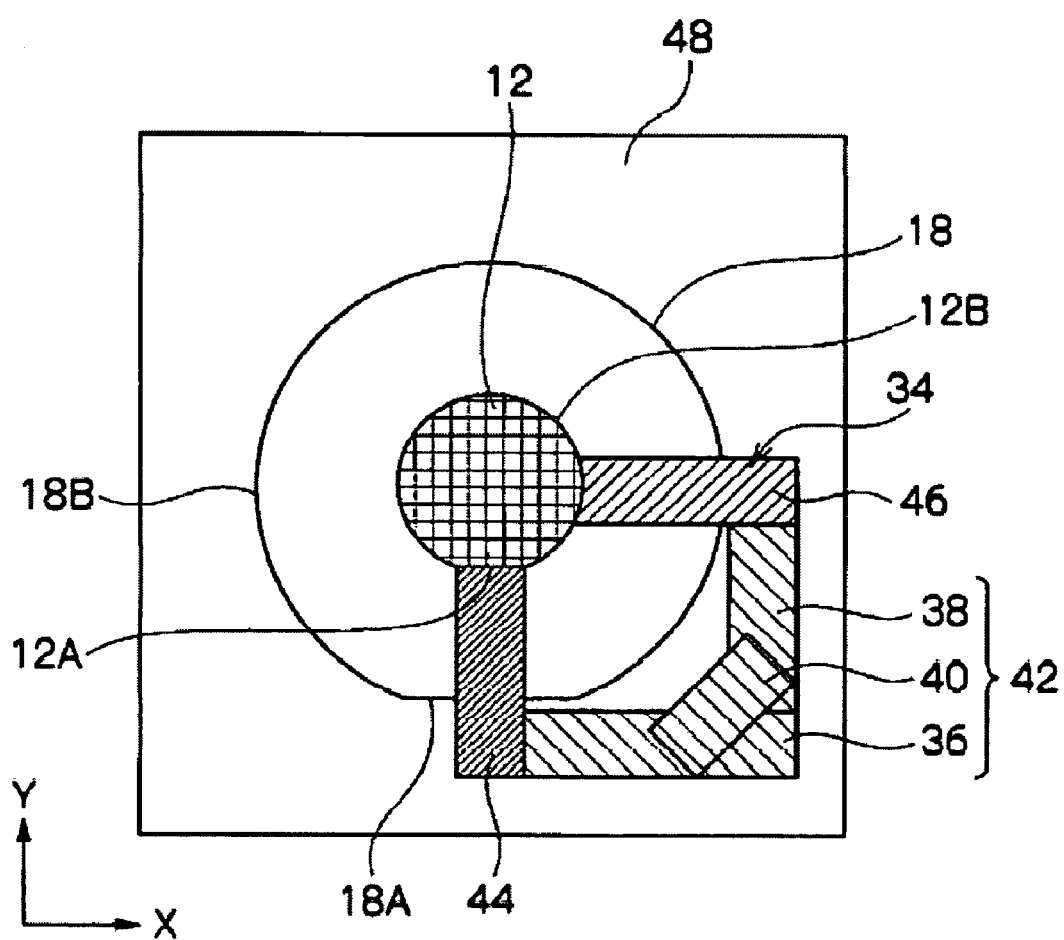
FIG. 7 is a plan view showing a state in which the alignment is performed using the alignment jig of FIG. 6.

FIG. 7 is a plan view showing a state in which the alignment is performed using the alignment jig of FIG. 6. In this example, on a placing table 48 having a rectangular shape as viewed from the above, the SiC wafer 12 is aligned with respect to the Si wafer 18 with the use of the alignment jig 34. The placing table 48, as with the work table 22, is constituted so that an object placed thereon can be heated at not lower than the melting point of the wax 20. As shown in FIG. 7, in the alignment, the orientation flat 18A of the Si wafer 18 is brought into contact with the side surface in the longitudinal direction of the first plate material 36 of the guide part 42, and the outer edge 18B of the Si wafer 18 is brought into contact with the side surface in the longitudinal direction of the second plate material 38 of the guide part 42.

The L-shaped guide part 42 is formed to have a thickness larger than the Si wafer 18 by several μm. The first and second arms 44 and 46 are stacked on the Si wafer 18. At this time, the orientation flat 12A of the SiC wafer 12 is brought into contact with one end surface of the first arm 44, and a circular-shaped outer edge 12B of the SiC wafer 12 is brought into contact with one end surface of the second arm 44. According to this, the SiC wafer 12 can be easily aligned with respect to the Si wafer 18.

When the alignment jig 34 is used, the "length" and "alignment position" of the first and second plate materials 36 and 38 and the first and second arms 44 and 46 of the alignment jig 34 are adjusted so that the SiC wafer 12 is disposed at a desired position. In this example, the SiC wafer 12 is stacked on the center of the Si wafer 18, and at the same time, the length and position of each part of the alignment jig 34 are adjusted so that the orientation flat 12A of the SiC wafer 12 is parallel to the orientation flat 18A of the Si wafer 18.

It is preferable that the alignment of the SiC wafer 12 is performed with high accuracy. In a wafer processing process (a so-called preceding process) for forming a circuit in a wafer, the accuracy of the alignment is important since photolithography is performed several times. In particular, in the wafer processing process in the SiC wafer 12, since it is necessary to perform ion-implantation activation heat treatment at a temperature of 1300° C. (degrees C.) or higher (normally, about 1600° C. (degrees C.)) in an impurity introduction process, the laminated substrate 10 cannot be processed as it is. The SiC wafer 12 is temporarily removed from the Si wafer 14, and after the impurity introduction process, the SiC wafer 12 is applied again to the Si wafer 14.

The impurity introduction process is executed after an alignment pattern or the like is formed on the SiC wafer 12 by the photolithography process. Thus, it is necessary to form the next pattern so as to conform to the previously formed pattern after the SiC wafer 12 is laminated again to the Si wafer 14. Therefore, highly accurate alignment of the SiC wafer 12 is constantly required. In particular, the initial alignment of the SiC wafer 12 with respect to the Si wafer 18 is very important.

Specifically, it is preferable that the alignment of the SiC wafer 12 is performed so that the angle (a deviation in the rotational direction) formed by the orientation flat 12A of the SiC wafer 12 and the orientation flat 18A of the Si wafer 18 is not more than 0.3° (degrees), and furthermore, so that the angle formed by the orientation flat 12A of the SiC wafer 12 and the orientation flat 14A of the Si wafer 14 is not more than 0.3° (degrees).

In an exposure machine (stepper) used in a photolithography technology, when a wafer is fed to an exposure stage, the orientation flat 14A of the Si wafer 14 with a large hole diameter of the laminated substrate 10 is recognized to perform a rough alignment (orientation flat alignment). With the orientation flat alignment, the deviation amount in the rotational direction of the Si wafer 14 is made to be about ±0.3° (degrees) and fed to the exposure stage. The exposure stage can be moved in parallel in the X direction and the Y direction perpendicular to the X direction. Thus, even if a deviation in the X and Y directions of around 1 mm occurs in the SiC wafer 12, these deviations can be eliminated by the movement of the exposure stage. Meanwhile, after the Si wafer 14 has been fed to the exposure stage, the deviation in the rotational direction cannot be corrected.

Accordingly, it is preferable that, in the production of the laminated substrate 10, an inspection process of inspecting whether or not the accuracy with respect to the rotation is not more than 0.3° (degrees) is provided to confirm whether or not the SiC wafer 12 is temporarily fixed to a predetermined position of the Si wafer 18. If the rotational accuracy is less than the reference value, the alignment of the SiC wafer 12 is repeated until the accuracy with respect to the rotation reaches not more than 0.3° (degrees). According to this, the SiC wafer 12 with a small hole diameter can be applied to the Si wafer 14 with a larger hole diameter with high positional accuracy.

Figure 8A:
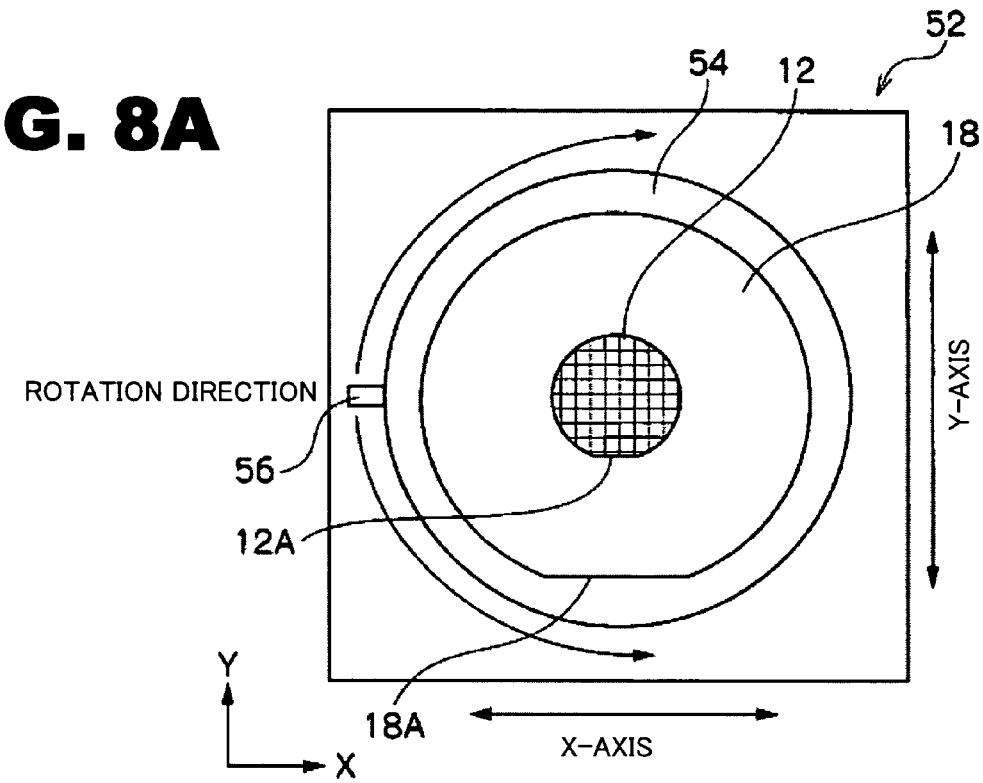
Figure 8B:
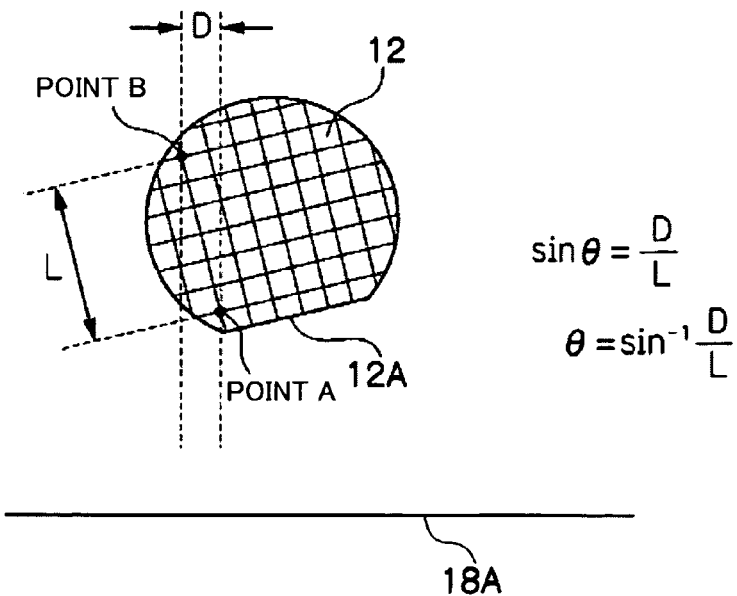

FIG. 8 explains a method for inspecting the rotational accuracy. FIG. 8A is a plan view showing a state in which the laminated substrate 10 is placed on an observation table. FIG. 8B is a view for explaining a method for measuring a deviation amount in a rotational direction. Here, a grid-like pattern for alignment is previously formed on the surface of the SiC wafer 12. The grid-like pattern is constituted of plural straight lines drawn at predetermined intervals in parallel with the orientation flat 12A and plural straight lines drawn at predetermined intervals in perpendicular to the orientation flat 12A. In this embodiment, the deviation amount in the rotational direction is measured using this pattern.

As an inspection device for inspecting the rotational accuracy, a general optical microscope having a movement mechanism for moving an observation table in parallel in the X and Y directions can be used. As shown in FIG. 8A, a disk-like stage 54 is rotatably attached to an observation table 52 of the inspection device. A knob 56 used for rotating the stage 54 is provided on the outer edge of the stage 54. The knob 56 is operated to allow the stage 54 to be rotated in the right or left direction.

When the rotational accuracy is inspected, the Si wafer 18 with the SiC wafer 12 temporarily fixed thereto through the wax 20 is placed on the stage 54 of the observation table 52, as shown in FIG. 8A. First, the state 54 is rotated by using the knob 56, whereby the position of the Si wafer 18 is visually, roughly adjusted so that the orientation flat 18A of the Si wafer 18 becomes parallel to the X direction of the observation table 52. Further, the orientation flat 18A is observed with an optical microscope while the observation table 52 is moved in the X direction, and the stave 54 is rotated to perform fine positional adjustment so that the orientation flat 18A becomes parallel to the X direction of the observation table 52.

Then, while the observation table 52 is moved in the Y direction, the grid-like pattern formed on the surface of the SiC wafer 12 is observed with the optical microscope to measure the deviation amount in the rotational direction of the SiC wafer 12. Since the SiC wafer 12 is transparent, the pattern formed on the front surface can be observed from the rear surface side.

For instance, an attention is focused on a line included in the grid-like pattern and passing through points A and B, as shown in FIG. 8B. Assuming that the length of the segment AB is represented as "L" and the distance in the X direction between the points A and B is represented as "D", the angle (the deviation amount in the rotational direction) $\theta$ formed by the orientation flat 12A of the SiC wafer 12 and the orientation flat 18A of the Si wafer 18 can be calculated by the following equation: $\theta = \sin^{-1}(D/L)$. The values "L" and "D" can be easily calculated based on the pattern dimensional information.

If $\theta$ is larger than 0.3° (degrees) as a result of measurement of the deviation amount in the rotational direction, the Si wafer 18 with the SiC wafer 12 temporarily fixed thereto through the wax 20 is returned onto the work table 22 shown in FIG. 5 and heated by the resistance heater 30 to fuse the wax 20, whereby the alignment of the SiC wafer 12 is performed again. For instance, the SiC wafer 12 is slightly moved with tweezers or the like to finely adjust the temporarily fixed position. After the fine positional adjustment, the deviation amount in the rotational direction is measured again to confirm whether "$\theta$" is not more than 0.3° (degrees). Repeatedly performing "confirmation" and "fine positional adjustment" enables precise alignment.

Note that a heater may be included in the stage 54 so that the temporarily fixed position of the SiC wafer 12 can be finely adjusted on the observation stable 52.

In order to obtain the rotational accuracy of not more than 0.3° (degrees) in the SiC wafer 12 with a hole diameter of 2 inches (with the diameter of 50 mm), it suffices that, when the pattern is observed while moving the observation table 52 in the Y direction, the distance in the X direction between the both ends of the longest straight line extending in the Y direction is set to be not more than 260 μm (0.26 mm). If $\theta$ is small, it can be approximated by the formula $D/L = \sin\theta \approx \theta$. In this case, $D = \theta \times L$. Thus, 50 mm×3.14×(0.3/360)×2=0.26 mm.

Figure 9B:
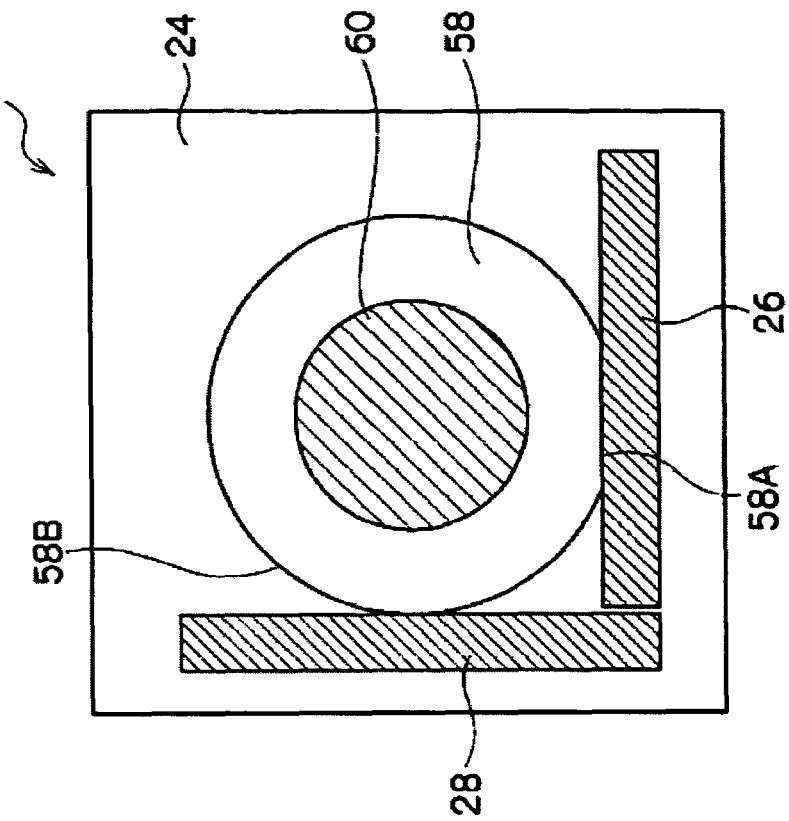
Figure 9A:
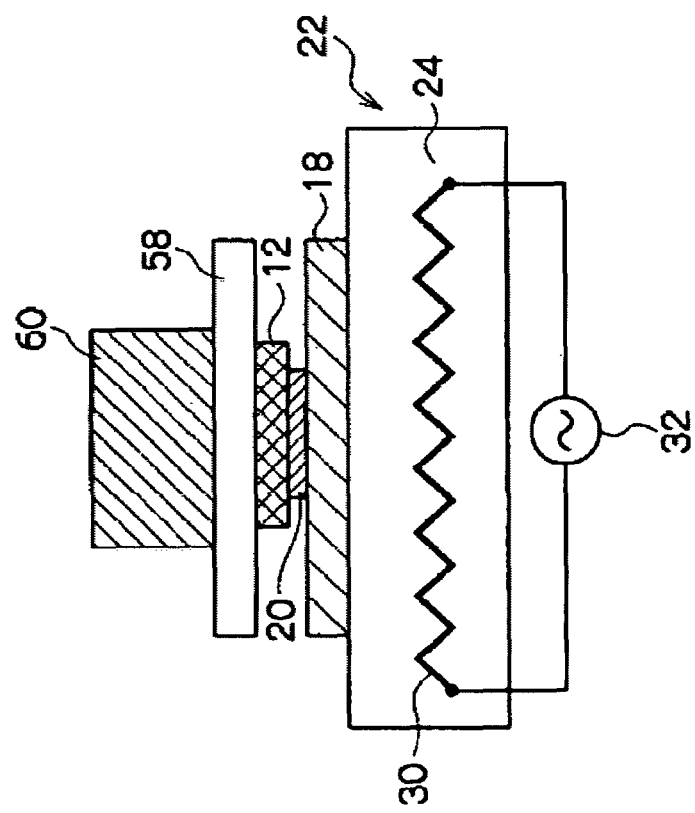

FIG. 9 shows a process of applying pressure to the SiC wafer. FIG. 9A is a side elevational view showing a state in which a load is applied onto the SiC wafer on the work table. FIG. 9B is a top plan view of the state shown in FIG. 9A.

As shown in FIGS. 9A and 9B, the Si wafer 18 with the SiC wafer 12 temporarily fixed thereto through the wax 20 is placed again on the plate 24 of the work table 22. The Si wafer 18 is aligned with the guides 26 and 28 and placed on the plate 24. A Si wafer 58 with the same hole diameter as the Si wafer 18 is stacked on the SiC wafer 12 temporarily fixed to the Si wafer 18. The Si wafer 58 is used as a plate material for pressing the SiC wafer 12. An orientation flat 58A of the Si wafer 58 is brought into contact with the guide 26, and a circular-shaped outer edge 58B is brought into contact with the guide 28, whereby the Si wafer 58 is positioned at the same position as the Si wafer 18 and stacked on the Si wafer 18.

Further, a weight 60 for loading is placed on the Si wafer 58 so as to be positioned at the center of the Si wafer 58. The load of the weight 60 is uniformly applied to the SiC wafer 12 through the plate-shaped Si wafer 58. Namely, the pressure is uniformly applied to the SiC wafer 12 from the rear surface side of the SiC wafer 12. With the Si wafer 58 and the weight 60 placed on the SiC wafer 12, the Si wafer 18 with the SiC wafer 12 temporarily fixed thereto through the wax 20 is heated at 180° C. by the resistance heater 30.

As shown in FIG. 5A, when the SiC wafer 12 is put on the wax 20, the wax 20 is not satisfactorily spread, and the surface of the SiC wafer 12 is tilted with respect to the surface of the Si wafer 18. As shown in FIG. 9A, the pressure is uniformly applied to the Si wafer 18 with the SiC ware 12 temporarily fixed thereto while being heated, so that the surface of the SiC wafer 12 becomes parallel to the surface of the Si wafer 18. In addition, the warpage of the SiC wafer 12 is eliminated, and thus the SiC wafer 12 is planarized.

In this embodiment, the SiC wafer 12 with a hole diameter of 2 inches (diameter of 50 mm) and a thickness of 350 μm is used. The weight 60 of about 5 kg is used so that the SiC wafer 12 is satisfactorily deformed to be planarized. Since the weight 60 of about 5 kg is used, the pressure of about 255 g/cm² is applied to the SiC wafer 12.

FIG. 10 shows a process of solidifying the wax. FIG. 10A is a side elevational view showing a state in which the wax is solidified on the work table to temporarily fix the SiC wafer. FIG. 10B is a top plan view of the state shown in FIG. 10A.

As shown in FIGS. 10A and 10B, the resistance heater 30 is turned off to decrease the temperature of the plate 24 with the Si wafer 58 and the weight 60 placed thereon, and the Si wafer 18 with the SiC wafer 12 temporarily fixed thereto through the wax 20 is cooled to not more than the melting point of the wax. As a result, the wax 20 is solidified to evenly support the SiC wafer 12 with the solidified wax 20. In this embodiment, the melting point of the wax 20 is 150° C., and it is confirmed that, once the temperature is decreased to around 130° C. (degrees-C.), the wax 20 is solidified to keep the flatness of the SiC wafer 12.

FIG. 11 shows a process of removing the weight and so on. FIG. 11A is a side elevational view showing a state in which the weight and so on are removed from above the work table. FIG. 11B is a top plan view of the state shown in FIG. 11A.

As shown in FIGS. 11A and 11B, the solidification of the wax 20 by cooling is confirmed, and thereafter, the Si wafer 58 and the weight 60 for pressing the SiC wafer. 12 are removed from the SiC wafer 12. The Si wafer 18 with the SiC wafer 12 temporarily fixed thereto through the wax 20 is remained on the plate 24. The Si wafer 18 with the SiC wafer 12 temporarily fixed thereto is put off from the plate 24 of the work table 22, and the above-described "temporal fixation process" is then complete.

(Adhesive Application Process)

Figure 12A:
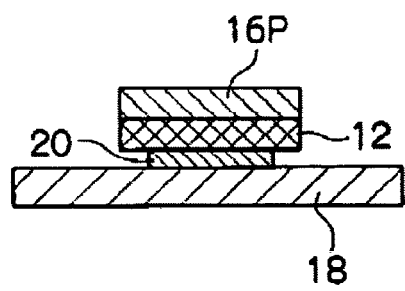
Figure 12B:
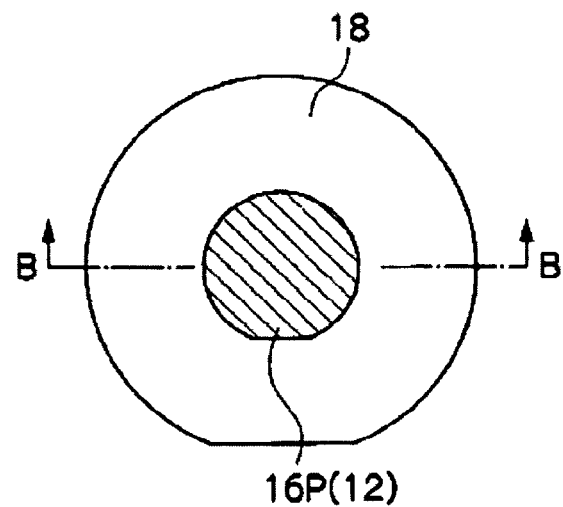

FIG. 12 shows a process of applying the SOG coating solution. FIG. 12A is a cross-sectional view in a state in which the SOG coating solution is applied to the temporarily fixed SiC wafer. FIG. 12B is a front side plan view of the state shown in FIG. 12A. FIG. 12A is a cross-sectional view taken along a line A-A shown in FIG. 12B.

As shown in FIGS. 12A and 12B, when the SiC wafer 12 is temporarily fixed to the Si wafer 18, the rear surface side of the SiC wafer 12 is exposed. The SOG coating solution is applied onto the rear surface of the SiC wafer 12 by a spin coat method. The SOG coating solution is applied onto the entire rear surface so as to cover the rear surface of the SiC wafer 12. The SOG film 16P is formed on the rear surface side of the SiC wafer 12. With this operation, the "application process" is complete.

As above described, in the SOG application liquid, alkoxysilane, which uses a silicon-oxygen (Si—O) bond as the framework and contains a silanol group (—Si—OH), is dissolved in an organic solvent vaporized at about 300° C. In this embodiment, the SOG coating solution of about 3 ml (milliliters) is dropped on the central part of the SiC wafer 12 with a hole diameter of 2 inches, and thereafter, the SiC wafer 12 is rotated at high speed at 1500 rmp to splash the solvent, thereby to form the SOG film 16P by the spin coat method.

The applied film thickness of the SOG film 16P is determined in accordance with the surface roughness of the rear surface of the SiC wafer 12. For instance, when the surface roughness of the rear surface of the SiC wafer 12 is about 500 nm, it is preferable to form the SOG film 16P with a film thickness of about 500 nm, comparable to the surface roughness of the rear surface of the SiC wafer 12. Note that, the surface roughness in this embodiment represents an arithmetic average roughness Ra stipulated in JIS B0601-1994.

(Wafer Adhesion Process)

FIG. 13 shows a process of stacking the SiC wafer on the Si wafer to be laminated. FIG. 13A is a side elevational view showing a state in which the SiC wafer is stacked on the Si wafer on the work table. FIG. 13B is a top plan view of the state shown in FIG. 13A.

As shown in FIGS. 13A and 13B, the Si wafer 14 is placed on the plate 24 of the work table 22. The Si wafer 14 has the same hole diameter as the Si wafer 18 and is other than the Si wafer 18. The Si wafer 14 is a substrate onto which the SiC wafer 12 is laminated. The orientation flat 14A of the Si wafer 14 is brought into contact with the guide 26, and the circular-shaped outer edge 14B is brought into contact with the guide 28, whereby the Si wafer 14 is positioned at a predetermined position on the plate 24 and placed on the plate 24. The Si wafer 18 with the SiC wafer 12 temporarily fixed thereto is placed on the Si wafer 14 so that the surface of the SiC wafer 12 with the SOG film 16P formed thereon is directed downward. The Si wafer 18 is positioned at the same position as the Si wafer 14 with the guides 26 and 28 and stacked on the Si wafer 14.

Further, a weight 62 for loading is placed on the Si wafer 18 so as to be positioned at the center of the Si wafer 18. In this embodiment, the weight 62 of about 5 kg is used. The load of the weight 62 is uniformly applied to the SiC wafer 12 through the plate-shaped Si wafer 18. Since the weight 62 of 5 kg is used, the pressure of about 255 g/cm$^2$ is applied to the SiC wafer 12. The pressure is uniformly applied to the SiC wafer 12 from the front surface side of the SiC wafer 12, and the SOG film 16P formed on the rear surface of the SiC wafer 12 is pressed against the Si wafer 14.

Since the Si wafer 18 is positioned at the same position as the Si wafer 14 with the same hole diameter as the Si wafer 18 and stacked on the Si wafer 14, the positional relation of the SiC wafer 12 to the Si wafer 18 becomes the same as the positional relation of the SiC wafer 12 to the Si wafer 14. Namely, the SiC wafer 12 is aligned through the Si wafer 18 and stacked on the Si wafer 14. The orientation flat 12A of the SiC wafer 12 becomes parallel to the orientation flat 14A of the Si wafer 14.

FIG. 14 shows a process of adhering the SiC wafer with the SOG film. FIG. 14A is a side elevational view showing a state in which the SiC wafer is adhered above the work table. FIG. 14B is a top plan view of the state shown in FIG. 14A.

As shown in FIGS. 14A and 14B, with the SOG film 16P pressed against the Si wafer 14, the temperature of the plate 24 is gradually increased close to the upper temperature limit temperature of the wax 20 by the resistance heater 30, thereby to heat the entirety of the SiC wafer 12, the Si wafer 14, the SOG film 16P, the Si wafer 18, and the wax 20. In this embodiment, the temperature of the plate 24 is increased to 350° C. as the upper temperature limit temperature of the wax 20.

The heat treatment is performed under pressure, thereby removing the organic solvent remaining in the SOG film 16P, and the SOG film 16P is solidified to become the SOG solidified film 16S. The SiC wafer 12 is firmly and closely fixed to the Si wafer 14 with the SOG solidified film 16S interposed therebetween. After the heat treatment is terminated, the resistance heater 30 is turned off to decrease the temperature of the plat 24 to cool the entirety of the SiC wafer 12, the Si wafer 14, the SOG film 16P, the Si wafer 18, and the wax 20. With this operation, the "adhesion process" is complete.

In the above adhesion process, the control of the rate of temperature increase and the control of the heat treatment time are important. The rate of temperature increase can be determined in accordance with the coated area of the SOG film 16P (the hole diameter of the SiC wafer 12). In this embodiment, the SiG wafer 12 with a hole diameter of 2 inches is used. In this case, it is preferable that the temperature is increased to 350° C. at speed not more than 60° C./min., and the heat treatment is performed for 5 minutes or more at 350° C. When the heat treatment is performed under the above conditions, the organic solvent is satisfactorily evaporated to be removed from the SOG film 16P near the center of the SiC wafer 12 with a hole diameter of 2 inches.

Meanwhile, for example, when the SiC wafer 12 with a hole diameter of 4 inches is used, it is preferable that the temperature is increased to 350° C. at speed not more than 30° C./min., and the heat treatment is performed for 10 minutes or more at 350° C. Since the distance required for elimination of the organic solvent becomes twice, the rate of temperature increase is reduced to half, and the time required for the heat treatment is doubled.

(Unneeded Substrate Removal Process)

FIG. 15 shows a process of removing the unneeded Si wafer. FIG. 15A is a side elevational view showing a state in which the unneeded wafer is removed from above the work table. FIG. 15B is a top plan view of the state shown in FIG. 15A.

As shown in FIGS. 15A and 15B, after the adhesion of the SiC wafer 12, the temperature of the plate 24 is increased close to the melting point of the wax 20 by the resistance heater 30 to fuse the wax 20, and thus, the Si wafer 18 and the weight 62 are removed from the SiC wafer 12. Since the wax 20 is in the fused state, the Si wafer 18 can be easily removed without causing damage to the surface of the SiC wafer 12.

The Si wafer 14 with the SiC wafer 12 adhered thereto with the SOG solidified film 16S interposed therebetween is remained on the plate 24. The unneeded Si wafer 18 is removed to complete the "removal process". However, as seen in FIG. 15B, the wax 20 remains adhered to the SiC wafer 12. Hereinafter, the wax 20 is removed from the SiC wafer 12.

Figure 16A:
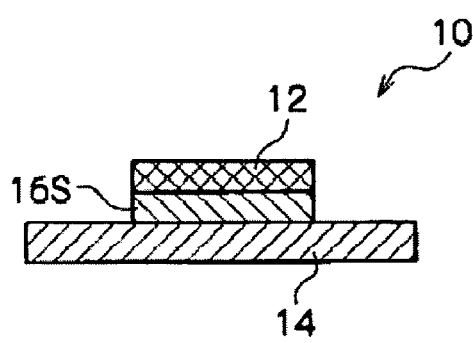
Figure 16B:
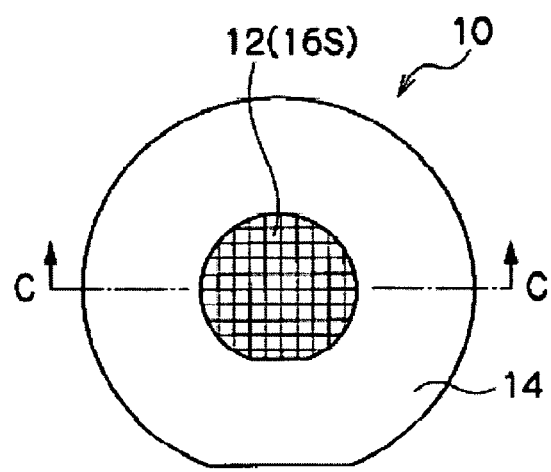

FIG. 16 shows a process of removing the wax. FIG. 16A is a cross-sectional view of the laminated substrate, with the wax removed. FIG. 16B is a front side plan view of the state shown in FIG. 16A. FIG. 16A is a cross-sectional view taken along a line C-C shown in FIG. 16B.

The Si wafer 14 with the SiC wafer 12 adhered thereto is put off from the plate 24 of the work table 22, and the wax 20 adhered to the surface of the SiC wafer 12 is removed. The wax 20 may be removed by organic cleaning using an organic solvent such as acetone or by inorganic cleaning using sulfuric acid+hydrogen peroxide. Since the SiC wafer 12 is closely adhered to the Si wafer 14 with the SOG solidified film 16S interposed therebetween, the wax 20 can be removed by cleaning.

As above described, in this embodiment, the SiC wafer 12 with a small hole diameter is aligned on and temporarily fixed to the Si wafer 18 for alignment with a larger hole diameter so that the orientation flats 12A and 18A become parallel to each other. The SiC wafer 12 temporarily fixed to the Si wafer 18 is overlapped with the Si wafer 14 and laminated to the Si wafer 14 with the SOG solidified film 16S interposed therebetween. The Si wafer 18 having the same diameter as the Si wafer 14 is easily overlapped with the Si wafer 14 in such a manner that the orientation flat 14A is aligned with the orientation flat 18A.

In addition, the Si wafer 18 is positioned at the same position as the Si wafer 14 with the same hole diameter as the Si wafer 18 and stacked on the Si wafer 14, the positional relation of the SiC wafer 12 to the Si wafer 18 becomes the same as the positional relation of the SiC wafer 12 to the Si wafer 14. Namely, the SiC wafer 12 is aligned to and stacked on the Si wafer 14 to be laminated to the Si wafer 14. The orientation flat 12A of the SiC wafer 12 becomes parallel to the orientation flat 14A of the Si wafer 14.

If the SiC wafer 12 is precisely aligned with respect to the Si wafer 18, the SiC wafer 12 is precisely aligned also with respect to the Si wafer 14. Thus, the SiC wafer 12 with a small diameter is laminated to the Si wafer 14 with a larger hole diameter while controlling the "position" and the "crystal orientation" of the SiC wafer 12, whereby the laminated substrate 10 can be produced. The laminated substrate 10 thus produced can be actually used in an existing manufacture line for an Si device because the "position" and the "crystal orientation" of the SiC wafer 12 are controlled. According to this, know-how in mass production techniques used for the manufacture of the Si device can be effectively utilized.

In addition, in this embodiment, the SiC wafer 12 is temporarily fixed to the Si wafer 18 through the wax 20. Since the wax 20 is fused by being heated to the melting point or higher, the position of the temporarily fixed SiC wafer 12 can be repeatedly adjusted until the SiC wafer 12 is precisely aligned, and at the same time, the unneeded Si wafer 18 can be easily removed. Additionally, with the aid of the wax 20, the surface of the SiC wafer 12 is protected from damages, such as scratches, particles (adhesion of dusts), and contamination. Further, since the heat-stable wax 20 is used, the wax 20 is altered to protect the surface of the SiC wafer 12 from damages when the SOG film 16P is solidified by the heat treatment.

Further, in this embodiment, the SiC wafer 12 is laminated to the Si wafer 14 with the SOG solidified film 16S interposed therebetween. When the heat treatment under pressure is performed, the remaining organic solvent is removed from the SOG film 16P, formed by application of the SOG solution, to solidify the SOG film 16P, and thus, the SOG film 16P becomes the SOG solidified film 16S having an excellent heat resistance. The SiC wafer 12 is firmly and closely adhered to the Si wafer 14 with the SOG solidified film 16S interposed therebetween. Namely, the laminated substrate 10 using the SOG solidified film 16S as an adhesive has an excellent heat resistance and adhesiveness. In particular, in this embodiment, the heat treatment is performed with gradually increasing the temperature of the SOG film 16P, so that the organic solvent is satisfactorily removed and the SOG solidified film 16S having an excellent heat resistance is formed. The SOG film 16P can be easily formed by the spin coat method.

In this embodiment, when the SiC wafer 12 is temporarily fixed to the Si wafer 18, the SiC wafer 12 is pressurized to be evenly supported by the solidified wax 20, which results in laminating the SiC wafer 12 to the Si wafer 14 in a flat state. Further, when the SOG film 16P is solidified to laminated the SiC wafer 12 to the Si wafer 14, the SiC wafer 12 is pressurized under heating to be pressed against the flat-shaped Si wafer 14, whereby the warpage of the SiC wafer 12 is eliminated, and the SiC wafer 12 is planarized.

In this embodiment, since, in the temporal fixation process, the SiC wafer 12 is aligned with respect to the Si wafer 18 using the alignment jig, the alignment can be very easily performed. Further provided is the inspection process of inspecting whether the accuracy with respect to the rotation is not more than 0.3° (degrees), after the alignment with the alignment jig. Thus, the alignment of the SiC wafer 12 is repeated until the accuracy with respect to the rotation reaches not more than 0.3° (degrees). This enables the SiC wafer 12 with a small hole diameter to be applied to the Si wafer 14 with a larger hole diameter with high positional accuracy. In addition, in the inspection process, it is possible to inspect whether the accuracy with respect to the rotation is not more than 0.3° (degrees) by a very simple and affordable method in which the alignment pattern previously formed on the SiC wafer 12 is observed with a microscope to measure the deviation amount in the rotational direction.

<Variation>

(High-Temperature Heat Treatment in Post-Treatment Process)

In the above embodiment, the heat treatment is performed at 350° C. (degrees C.) to adhere the SiC wafer to the Si wafer. However, when a semiconductor process at 350° C. (degrees C.) or higher is performed in a laminated substrate, it is preferable that, after the wax is removed by cleaning, the heat treatment at a semiconductor process temperature or higher is performed as the post-treatment. Since the SOG solidified film used as an adhesive undergoes plastic deformation in accordance with the temperature in the heat treatment, the rate of temperature raise is satisfactorily decreased to perform the post-treatment. This makes it possible to prevent the occurrence of removal of wafers, and also to prevent the SiC wafer or the Si wafer from being damaged by stress.

For instance, in the post-treatment process, the SiC wafer with a hole diameter of 2 inches is preferably applied with the high-temperature heat treatment at 850° C. at the rate of temperature raise of not more than 30° C./min. When the temperature is gradually increased, the SOG solidified film is subjected to slow plastic deformation to reduce the remaining stress. If the above post-treatment is not performed, some problems may occur when the semiconductor process at 350° C. (degrees C.) or higher is performed. When the laminated substrate, to which no post-treatment is applied, is placed on a susceptor (placement table) heated to 450° C. (degrees C.), the SiC wafer is damaged. On the other hand, the laminated substrate subjected to the post-treatment is placed on the susceptor heated to 450° C. (degrees C.), the SiC wafer is not damaged.

Figure 17:
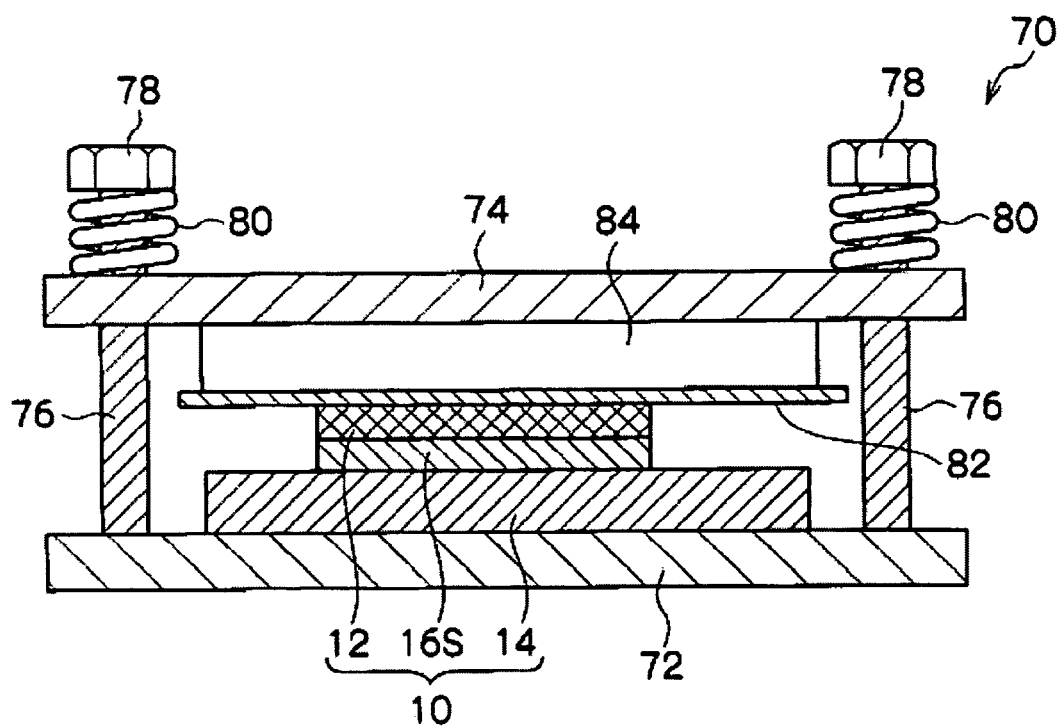
FIG. 17 is a schematic view of a pressing jig used in the high-temperature heat treatment under pressure.

In the above variation, the high-temperature heat treatment in the post-treatment process is performed without weight. However, the high-temperature heat treatment is performed under pressure, whereby the degree of adhesion between the SiC wafer and the Si wafer is further increased. For instance, the laminated substrate to which the high-temperature heat treatment at 1000° C. (degrees C.) is applied has a heat resistance of 1000° C. (degrees C.). FIG. 17 is a schematic view of a pressing jig used in the high-temperature heat treatment under pressure. As shown in FIG. 17, this pressing jig 70 has a plate 72 and a plate 74 facing the plate 72. The Si wafer 14 (the laminated substrate 10), to which the SiC wafer 12 is adhered with the SOG solidified film 16S interposed therebetween, is sandwiched in between the plates 72 and 74.

The plate 72 has plural (at least three) bolts 76. Each end of the bolts 76 is fixed onto one surface of the plate 72. Meanwhile, the plate 74 has plural through-holes (not shown) through which the respective bolts 76 pass. The plate 74 is overlapped with the plate 72 so as to allow the bolts 76 to respectively pass through the through holes. Additionally, there are plural nuts 78 provided so as to respectively correspond to the bolts 76. The plates 72 and 74 are mutually fastened by the combination of the bolts 76 and the nuts 78, so that the laminated substrate 10 is sandwiched between the plates 72 and 74.

There are plural buffer springs 80 corresponding to the respective nuts 78. Each buffer spring 80 is sandwiched in between the corresponding nut 78 and the plate 74. Under high temperature, the thermal expansion of the bolt 76 is required to be considered, and the effect of the thermal expansion of the bolt 76 is mitigated by using the buffer spring 80.

It is preferable that the high-temperature heat treatment under pressure is performed by using the pressing jig 70 and a technique such as management of screw-tightening torque. It is preferable that the laminated substrate 10 is heated while being pressurized using a jig, which has the same structure as the pressing jig 70 shown in FIG. 17, so that the pressure of not less than 255 g/cm² is applied to the SiC wafer 12. Also, in order to prevent the surface of the SiC wafer 12 from being damaged, it is preferable that a graphite film 82 having a heat resistance and a Si wafer 84 are sandwiched in this order between the SiC wafer 12 and the plate 74 from the SiC wafer 12 side. The graphite film 82 having a heat resistance of 1000° C. (degrees C.) or higher is preferably used.

In the prior art, the maximum temperature at which a laminated substrate can be heated while being subjected to weight bearing depends on the performance of a heater. In general, the upper limit of the maximum temperature is supposed to be about 600° C. In order to heat the laminated substrate 10 to 600° C. (degrees C.) or higher, heat treatment in a furnace is required. If the pressing jig 70 is used, it is possible to realize the heat treatment at 600° C. (degrees C.) or higher in a furnace while applying weight to the laminated substrate. As a result, even in the high-temperature semiconductor process (for example, 1000° C. (degrees C.)), the laminated substrate 10 can be processed as it is without removing the SiC wafer 12.

When the SiC wafer 12, before being laminated to the Si wafer 14, has a large warpage, there may arise a problem such as reduction of focal depth margin in the photolithography process and deterioration of the uniformity in the etching and CVD processes. However, as above described, the high-temperature heat treatment is performed under pressure in such a state that the SiC wafer 12 is laminated to the Si wafer 14 having excellent flatness, whereby the warpage of the SiC wafer 12 can be reduced.

(Peeling of SiC Wafer)
When the SiC wafer adhered to the Si wafer with the SOG solidified film interposed therebetween is peeled from the Si wafer, the laminated substrate may be soaked in a fluoronitric acid solution. The fluoronitric acid solution contains at least HF+HNO₃ and, if necessary, contains water and acetic acid. The Si wafer is easily dissolved in the fluoronitric acid solution, and the SiC wafer which is not dissolved in the fluoronitric acid solution remains. However, if various films have been formed on the SiC wafer in the device production process, the surface of the SiC wafer is required to be protected so that these formed films are not corroded by a fluoronitric acid. For instance, the wax used for temporal fixation may be applied onto the surface of the SiC wafer so as to protect the surface.

(Substrate to which Si Wafer is to be Laminated)
In the above embodiment, the SiC wafer with a small hole diameter is laminated to the Si wafer (silicon substrate) with a larger hole diameter to produce the laminated substrate. However, the SiC wafer with a small hole diameter may not be laminated to the silicon substrate, and may be applied to a substrate which can be processed by an existing semiconductor device manufacturing apparatus in such a state that the SiC wafer is laminated to the substrate. For example, a quartz (SiO₂) substrate and a sapphire substrate can be used instead of the silicon substrate. It is preferable that a substrate to which the Si wafer is to be laminated has a hole diameter of 5 to 8 inches and a film thickness of 30 μm (micrometers) to 2 mm.

The quartz substrate and the sapphire substrate are transparent. For this reason, these substrates are preferably finished to have, for example, a frosted-glass-like surface for use. These substrates having a frosted-glass-like surface are easily detected by a sensor. Since the quartz substrate is less likely to undergo heat conduction than the silicon substrate, the time required for heating in the film-formation should be satisfactorily elongated. In addition, since the quartz substrate and the sapphire substrate are insulating substrates, it is necessary to pay attention that the process conditions may be changed in a process using plasma.

Further, since the sapphire substrate is not dissolved in the fluoronitric acid solution, the SiC wafer is peeled from the sapphire substrate, and thus, the sapphire substrate can be used again. Thus, the sapphire substrate could contribute to the cost reduction. However, in order to peel the SiC wafer from the sapphire substrate, the fluoronitric acid solution should be impregnated into a gap between the SiC wafer and the sapphire substrate to dissolve the SOG solidified film. Therefore, the time required for peeling the SiC wafer is longer than the case of using the silicon substrate and the quartz substrate.

(Wafer to be Laminated)
In the above embodiment, although the SiC wafer with a small hole diameter is laminated to produce the laminated substrate, the semiconductor wafer laminated is not limited to a silicon carbide single crystal substrate. A wafer formed of other semiconductor crystal, in which the crystal growth is very difficult and the increase of the hole diameter is difficult, can be laminated.

What is claimed is:
1. A method for manufacturing a semiconductor substrate, comprising:
a temporal fixation step of preparing a wafer formed of a semiconductor single crystal and a first substrate with a hole diameter larger than the wafer to overlap the wafer and the first substrate with each other so that the front surface of the wafer and the first substrate face each other, and thus to perform alignment of the wafer with reference to an orientation flat of the wafer and a first mark provided in the first substrate, whereby the wafer is temporarily fixed to a predetermined position of the first substrate in a position-adjustable manner;

an application step of applying an adhesive on the rear surface of the wafer temporarily fixed to the first substrate;

an adhesion step of preparing a second substrate, which has the same hole diameter and shape as the first substrate and has a second mark at the same position as the first substrate, to perform alignment so that the first and second substrates are overlapped with each other with reference to the first and second marks, and thus to overlap the wafer and the second substrate so that the rear surface of the wafer and the second substrate face each other, whereby the wafer temporarily fixed to the first substrate is adhered to the second substrate through the adhesive; and a removal step of removing the first substrate to which the wafer is temporarily fixed.

2. The method for manufacturing a semiconductor substrate according to claim 1, wherein in the temporal fixation step, a wax having a predetermined melting point is applied to the first substrate, the first substrate is heated at the melting point or higher to be fused, and the first substrate is cooled at below the melting point after the alignment of the wafer, whereby the wafer is temporarily fixed to the first substrate.

3. The method for manufacturing a semiconductor substrate according to claim 2, wherein the wax has a melting point of 100° C. (degrees C.) or higher and a heat resistance of 400° C. (degrees C.) or higher.

4. The method for manufacturing a semiconductor substrate according to claim 1, wherein in the temporal fixation step, the wafer is temporarily fixed to the first substrate in such a state that the wafer is uniformly pressed from the rear surface side.

5. The method for manufacturing a semiconductor substrate according to claim 1, wherein in the application step, a spin-on glass (SOG) solution as an adhesive is applied to form an SOG film, and at the same time, in the adhesion step, the wafer and the second substrate are overlapped with each other and then the SOG film is heated under pressure to solidify the SOG film, thereby adhering the wafer to the second substrate.

6. The method for manufacturing a semiconductor substrate according to claim 1, wherein the semiconductor single crystal is silicon carbide (SiC) single crystal.

7. The method for manufacturing a semiconductor substrate according to claim 1, wherein each hole diameter of the first substrate and the second substrate is 5 to 8 inches.

8. The method for manufacturing a semiconductor substrate according to claim 1, wherein the first substrate and the second substrate are any one selected from the group consisting of a silicon substrate, a quartz substrate, and a sapphire substrate.

9. The method for manufacturing a semiconductor substrate according to claim 1, wherein each film thickness of the first substrate and the second substrate is 300 µm to 2 mm.

10. The method for manufacturing a semiconductor substrate according to claim 1, wherein the first mark and the second mark are orientation flats.

11. The method for manufacturing a semiconductor substrate according to claim 10, wherein the alignment of the wafer is performed so that the orientation flat of the wafer is parallel to the orientation flat of the first substrate.

12. The method for manufacturing a semiconductor substrate according to claim 10, wherein the alignment of the wafer is performed using an alignment jig comprising:

an L-shaped guide part including: an elongated first plate material having one side surface in the longitudinal direction with which the orientation flat of the first substrate is brought into contact; and an elongated second plate material having one end surface which is bonded to the side surface on one end side of the first plate material so that the first and second plate materials form an L shape and also one side surface in the longitudinal direction with which an outer edge of the first substrate is brought into contact;

an elongated first arm which is bonded in the state of being overlapped with the first plate material so as to intersect with the first plate material of the guide part and has one end surface brought into contact with the orientation flat of the wafer; and an elongated second arm which is bonded to the second plate material of the guide part in the state of being overlapped with the second plate material so as to intersect with the second plate material and has one end surface brought into contact with a circular-shaped outer edge of the wafer.

13. The method for manufacturing a semiconductor substrate according to claim 10, wherein a pattern including straight lines parallel or perpendicular to the orientation flat of the wafer is previously formed in the wafer, and, in the temporal fixation step, an angle formed by the straight lines and the orientation flat of the first substrate is observed to perform the alignment of the wafer.

14. The method for manufacturing a semiconductor substrate according to claim 13, wherein the alignment of the wafer is performed so that the angle formed by the straight lines and the orientation flat of the first substrate is not more than 0.3° (degrees).

* * * * *